US008773889B2

(12) United States Patent
Tokiwa

(10) Patent No.: US 8,773,889 B2
(45) Date of Patent: Jul. 8, 2014

(54) SEMICONDUCTOR MEMORY DEVICE

(71) Applicant: Kabushiki Kaisha Toshiba, Minato-ku (JP)

(72) Inventor: Naoya Tokiwa, Fujisawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 13/771,832

(22) Filed: Feb. 20, 2013

(65) Prior Publication Data

US 2013/0163309 A1    Jun. 27, 2013

Related U.S. Application Data

(62) Division of application No. 12/769,991, filed on Apr. 29, 2010, now Pat. No. 8,400,814.

(30) Foreign Application Priority Data

Apr. 30, 2009  (JP) ................................ 2009-111286
Mar. 12, 2010  (JP) ................................ 2010-056384

(51) Int. Cl.
    *G11C 11/00*    (2006.01)
(52) U.S. Cl.
    USPC ....... 365/148; 365/100; 365/189.05; 365/236
(58) Field of Classification Search
    USPC ............................. 365/148, 100, 189.05, 236
    See application file for complete search history.

(56) References Cited

U.S. PATENT DOCUMENTS

| 7,606,059 | B2 | 10/2009 | Toda |
| 7,633,789 | B2 | 12/2009 | Norman |
| 7,701,747 | B2 | 4/2010 | Park et al. |
| 7,760,539 | B2 * | 7/2010 | Katoh ........................... 365/148 |
| 7,796,451 | B2 | 9/2010 | Norman |
| 7,911,854 | B2 * | 3/2011 | Nagashima et al. ..... 365/189.06 |
| 7,978,497 | B2 * | 7/2011 | Maejima ....................... 365/148 |
| 8,117,508 | B2 | 2/2012 | Tokiwa |

(Continued)

FOREIGN PATENT DOCUMENTS

| JP | 7-302176 | 11/1995 |
| JP | 2002-334592 | 11/2002 |

(Continued)

OTHER PUBLICATIONS

Japanese Office Action issued Jun. 4, 2013, in Japan Patent Application No. 2010-056384 (with English translation).

*Primary Examiner* — Pho M Luu
(74) *Attorney, Agent, or Firm* — Oblon, Spivak, McClelland, Maier & Neustadt, L.L.P.

(57) ABSTRACT

A semiconductor memory device includes a memory cell array configured of at least a first portion and a second portion each including a plurality of memory cells each with a variable resistor which stores an electrically rewritable resistance value as a data, and a control circuit which controls a first operation including selected one of operations to erase, write and read the data in the first portion and a second operation including selected one of operations to erase, write and read the data in the second portion, the first operation and the second operation being performed in temporally overlapped relation with each other.

3 Claims, 25 Drawing Sheets

(56) References Cited

U.S. PATENT DOCUMENTS

| | | | | |
|---|---|---|---|---|
| 8,400,814 | B2* | 3/2013 | Tokiwa | 365/148 |
| 8,456,887 | B2* | 6/2013 | Iwata | 365/148 |
| 8,467,225 | B2* | 6/2013 | Inoue | 365/148 |
| 2008/0258129 | A1 | 10/2008 | Toda | |
| 2010/0211725 | A1* | 8/2010 | Nagashima et al. | 711/103 |
| 2010/0214831 | A1 | 8/2010 | Kim et al. | |

FOREIGN PATENT DOCUMENTS

| | | |
|---|---|---|
| JP | 2005-522045 | 7/2005 |
| JP | 2006-514393 | 4/2006 |
| JP | 2007-250171 | 9/2007 |
| JP | 2010-113742 | 5/2010 |
| WO | WO 2008/032394 A1 | 3/2008 |
| WO | WO 2009/016824 A1 | 2/2009 |

* cited by examiner

Example of plane configuration

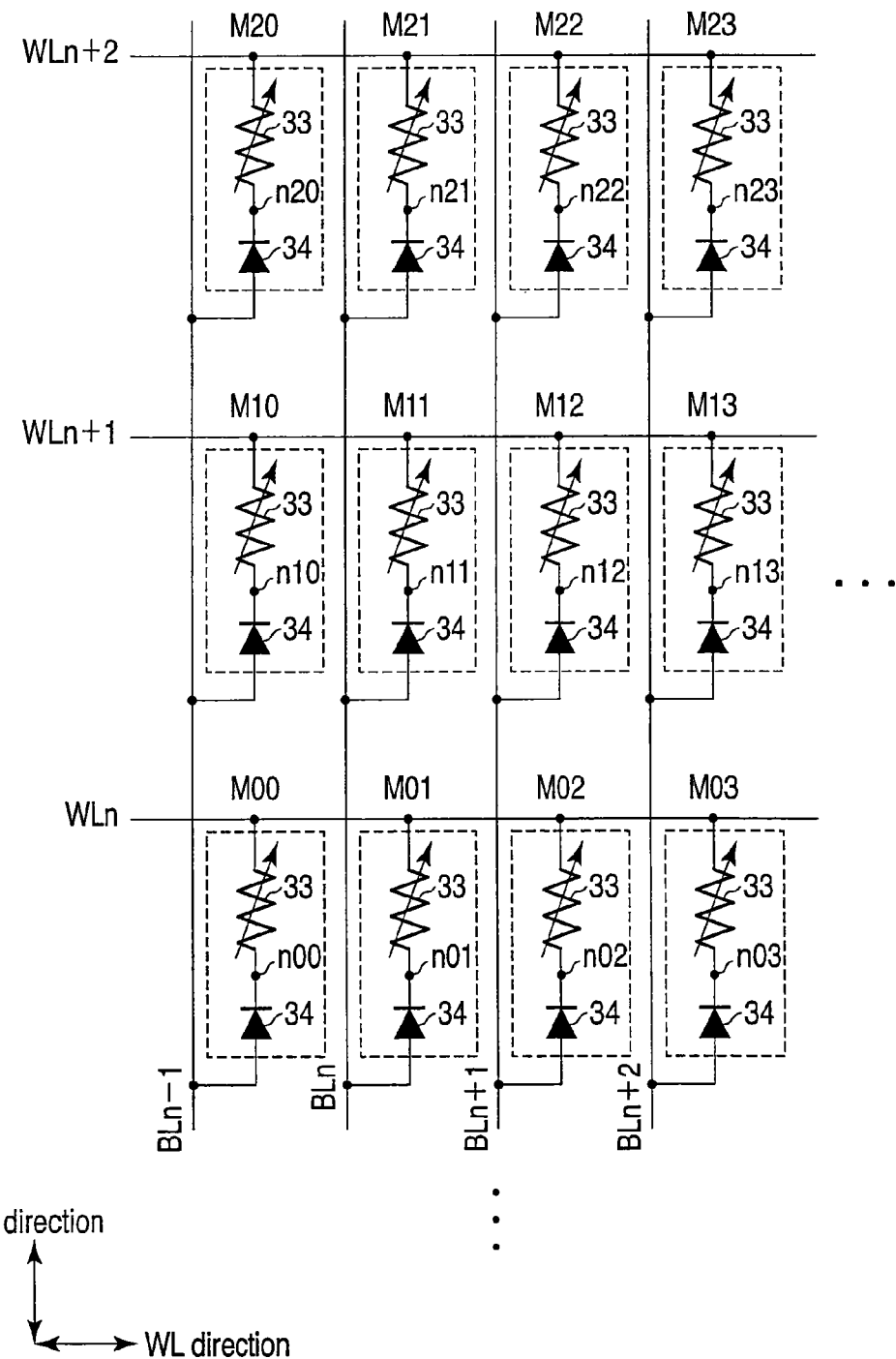
F I G. 4

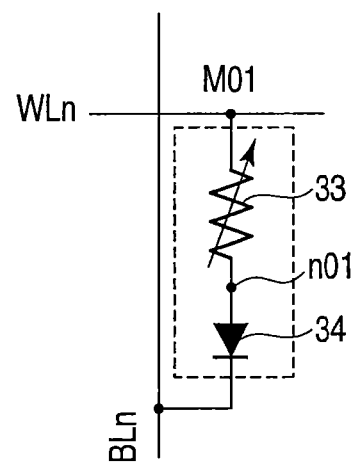
F I G. 5
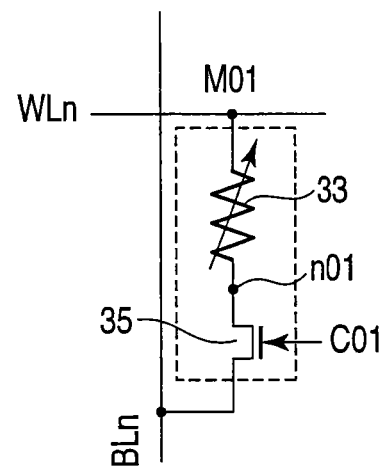
F I G. 6

Example of configuration under layers

Modification (other control operations)

|  | | Plane 0 | | |
|---|---|---|---|---|
|  | | Program | Read | Erase |
| Plane 1 | Program | ○ | ○ | ○ |
|  | Read | ◎ | ○ | ○ |
|  | Erase | ○ | ○ | ○ |

(◎ : Control operation explained in first and second embodiment
○ : Control operation realizable in present invention)

F I G. 15

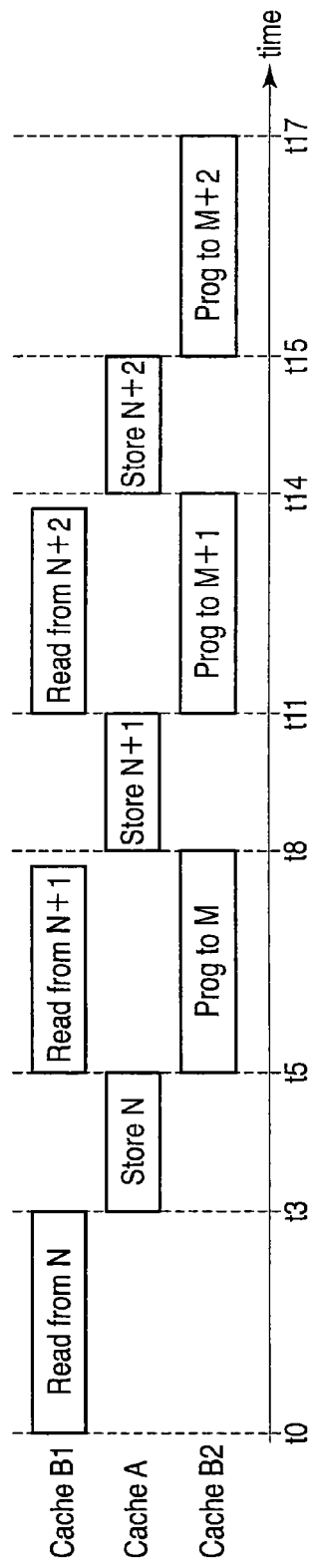
F I G. 18

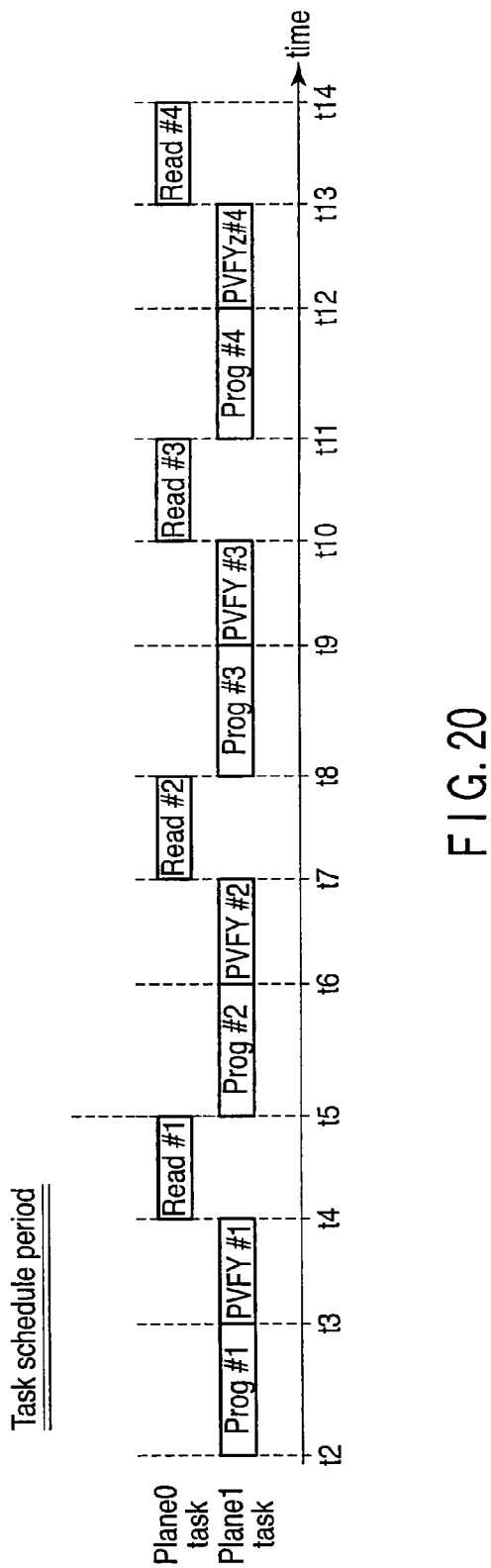
F I G. 20

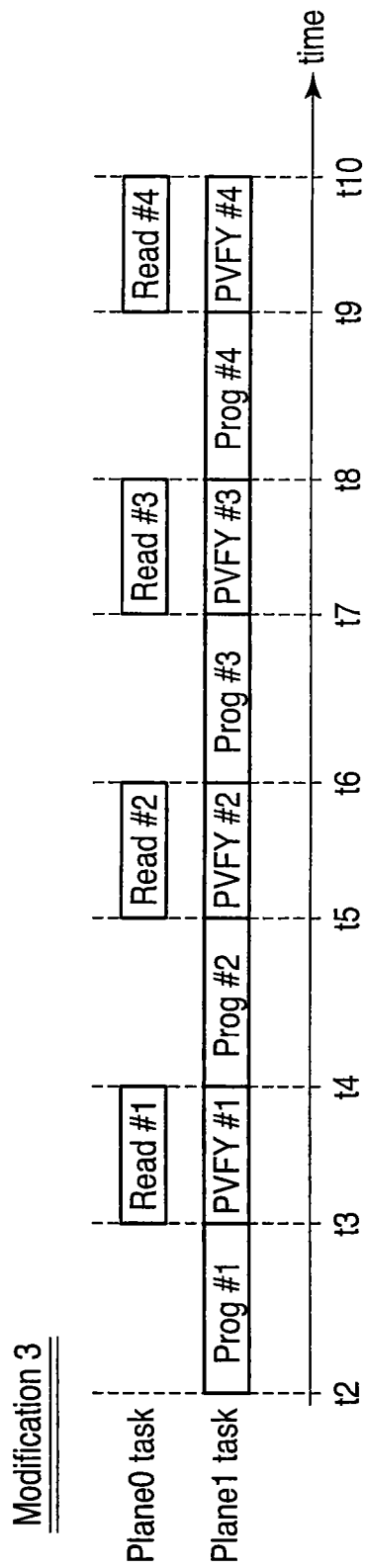
F I G. 24

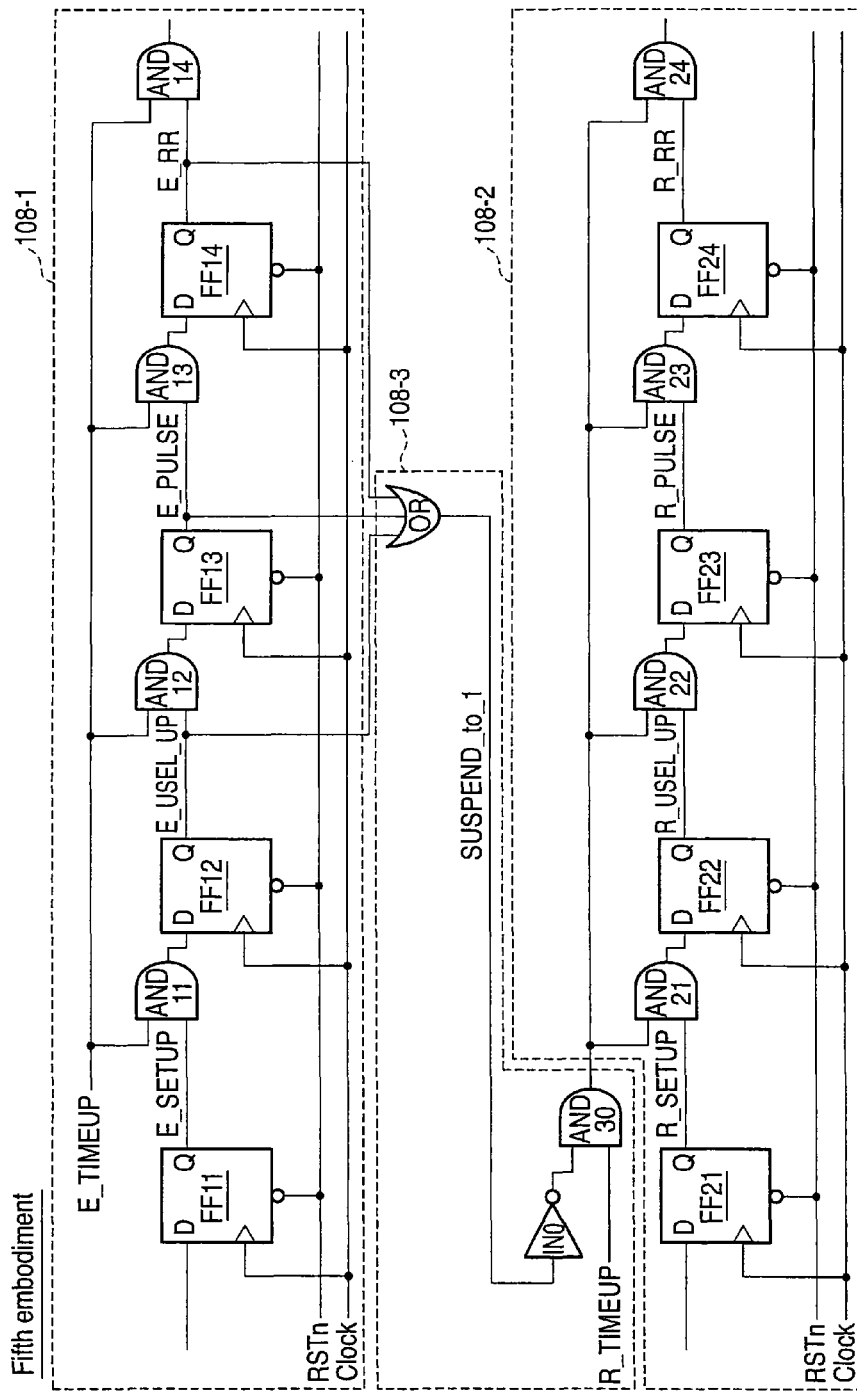
F I G. 25

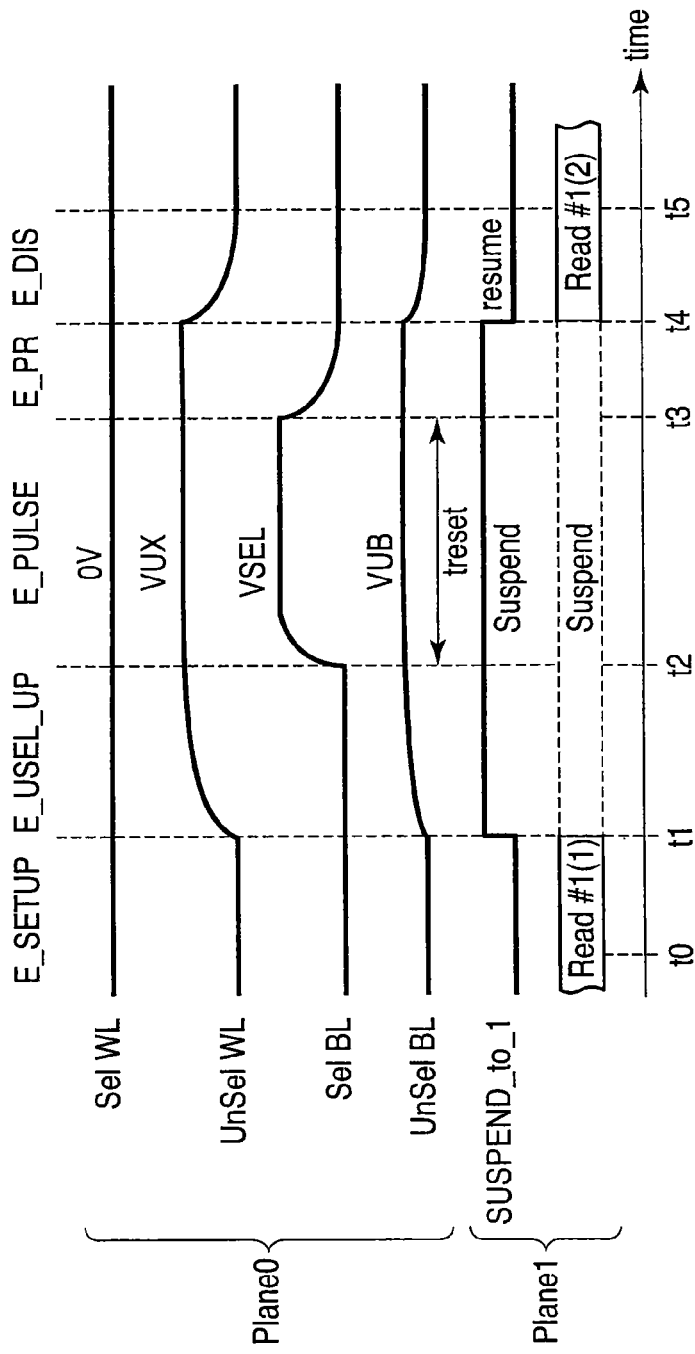
F I G. 26

SEMICONDUCTOR MEMORY DEVICE

CROSS-REFERENCE TO RELATED APPLICATIONS

This application is a divisional of U.S. application Ser. No. 12/769,991 filed Apr. 29, 2010, now U.S. Pat. No. 8,400,814, and is based upon and claims the benefit of priority from prior Japanese Patent Application No. 2009-111286, filed Apr. 30, 2009, and Japanese Patent Application No. 2010-056384, filed Mar. 12, 2010, the entire contents of each of which are incorporated herein by reference.

BACKGROUND

1. Field

Embodiments relate to a semiconductor memory device, in particular, to a semiconductor memory device applicable to, for example, PCRAM and ReRAM.

2. Description of the Related Art

A storage configuration using a resistance change of three-dimensionally stacked elements to realize a large capacity of a semiconductor memory device has been proposed by, for example, Jpn. PCT National Publication No. 2005-522045 and Jpn. PCT National Publication No. 2006-514393. PCRAM (Phase Change Random Access Memory) using a chalcogenide element and ReRAM (Resistance Random Access Memory) using a transfer metal oxide as a variable resistor are typical examples.

BRIEF SUMMARY OF THE INVENTION

According to an aspect of embodiments, a semiconductor memory device comprising: a memory cell array configured of at least a first portion and a second portion each including a plurality of memory cells each with a variable resistor which stores an electrically rewritable resistance value as a data; and a control circuit which controls a first operation including selected one of operations to erase, write and read the data in the first portion and a second operation including selected one of operations to erase, write and read the data in the second portion, the first operation and the second operation being performed in temporally overlapped relation with each other.

BRIEF DESCRIPTION OF THE DRAWINGS

FIG. 4 is an equivalent circuit diagram showing an example of a layer configuration of the nonvolatile semiconductor memory device according to the first embodiment;

FIG. 5 is an equivalent circuit diagram showing another example of a memory cell;

FIG. 6 is an equivalent circuit diagram showing still another example of a memory cell;

FIG. 15 is a diagram for explaining other control operations of a nonvolatile semiconductor memory device according to a modification;

FIG. 18 is a timing chart showing the state in which the data is occupied by the first to third data holding circuits in FIG. 16;

FIG. 20 is a detailed timing chart for the task schedule period in FIG. 19;

FIG. 24 is a timing chart showing the control sequence for a nonvolatile semiconductor memory device according to a third modification;

FIG. 25 is a circuit diagram showing an example of the configuration of a nonvolatile semiconductor memory device according to a fifth embodiment; and FIG. 26 is a timing chart showing the control sequence for the nonvolatile semiconductor memory device according to the fifth embodiment.

DETAILED DESCRIPTION

Figure 1:
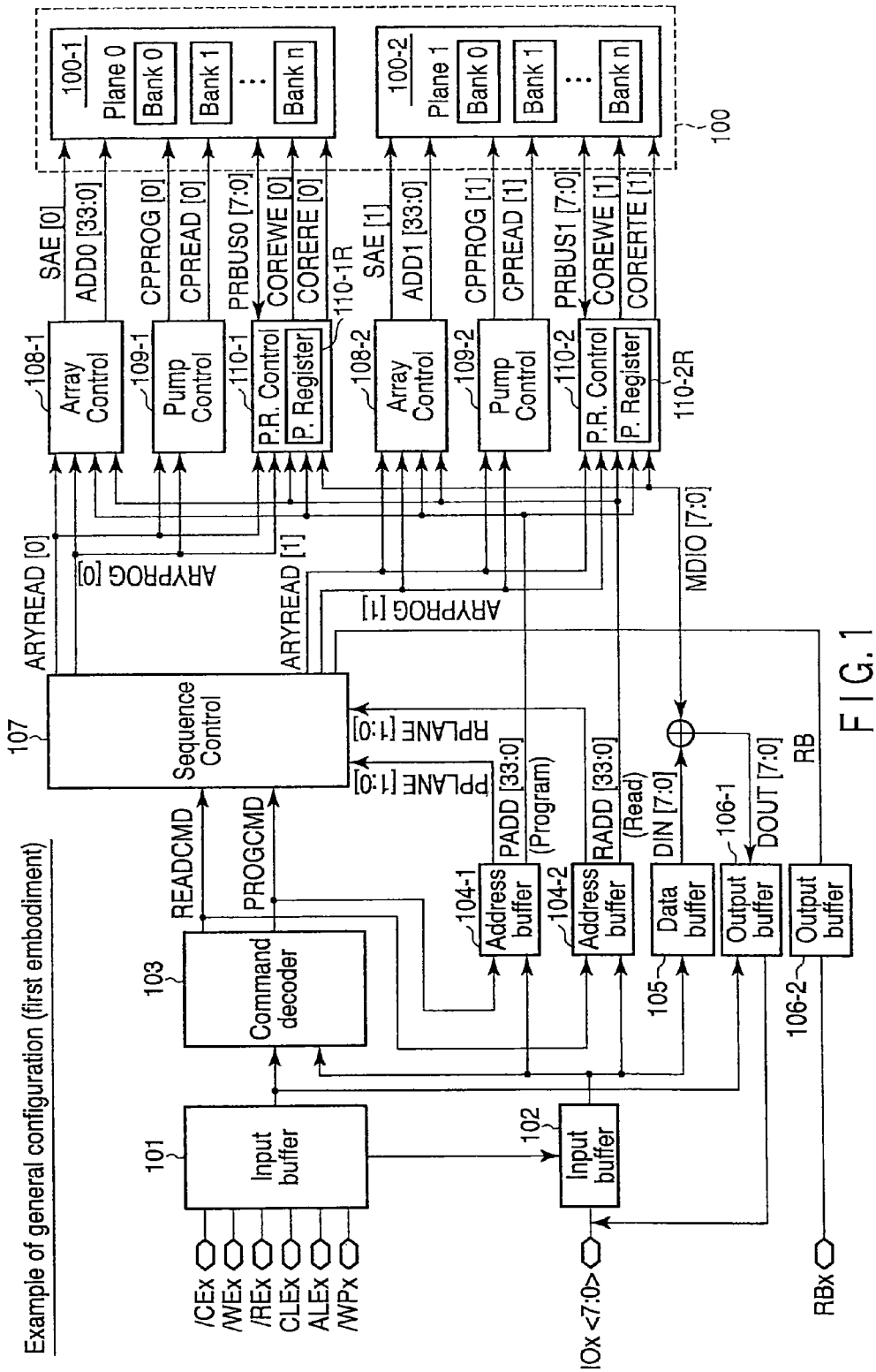
FIG. 1 is a block diagram showing a nonvolatile semiconductor memory device according to a first embodiment.

Many semiconductor memory devices described in the patent publications described above are configured to perform a write, erase or read operation by page, and this operation consumes a long time (for example, approximately several hundred microseconds to several milliseconds).

In the semiconductor memory device, the write or erase operation requires a longer time than the read operation. In the case where the read operation is required during the write or erase operation, the completion of the write or erase operation has to be awaited.

This tends to deteriorate the overall performance of the system using the semiconductor memory device disadvantageously hampering an increase in operation speed.

In view of this, embodiments are explained with reference to the drawings. In this explanation, the same component elements are designated by the same reference numerals in all the drawings.

[First Embodiment]

A nonvolatile semiconductor memory device according to a first embodiment and a control operation thereof are explained below with reference to FIGS. 1 to 11. According to this embodiment, ReRAM (Resistance Random Access Memory) using a variable resistor is taken as an example of the nonvolatile semiconductor memory device.

<1. Configuration Example>

1-1 Example of General Configuration

First, an example of a general configuration of the nonvolatile semiconductor memory device according to the first embodiment is explained with reference to FIG. 1. As shown in FIG. 1, the nonvolatile semiconductor memory device according to this embodiment has the configuration described below.

Figure 2:
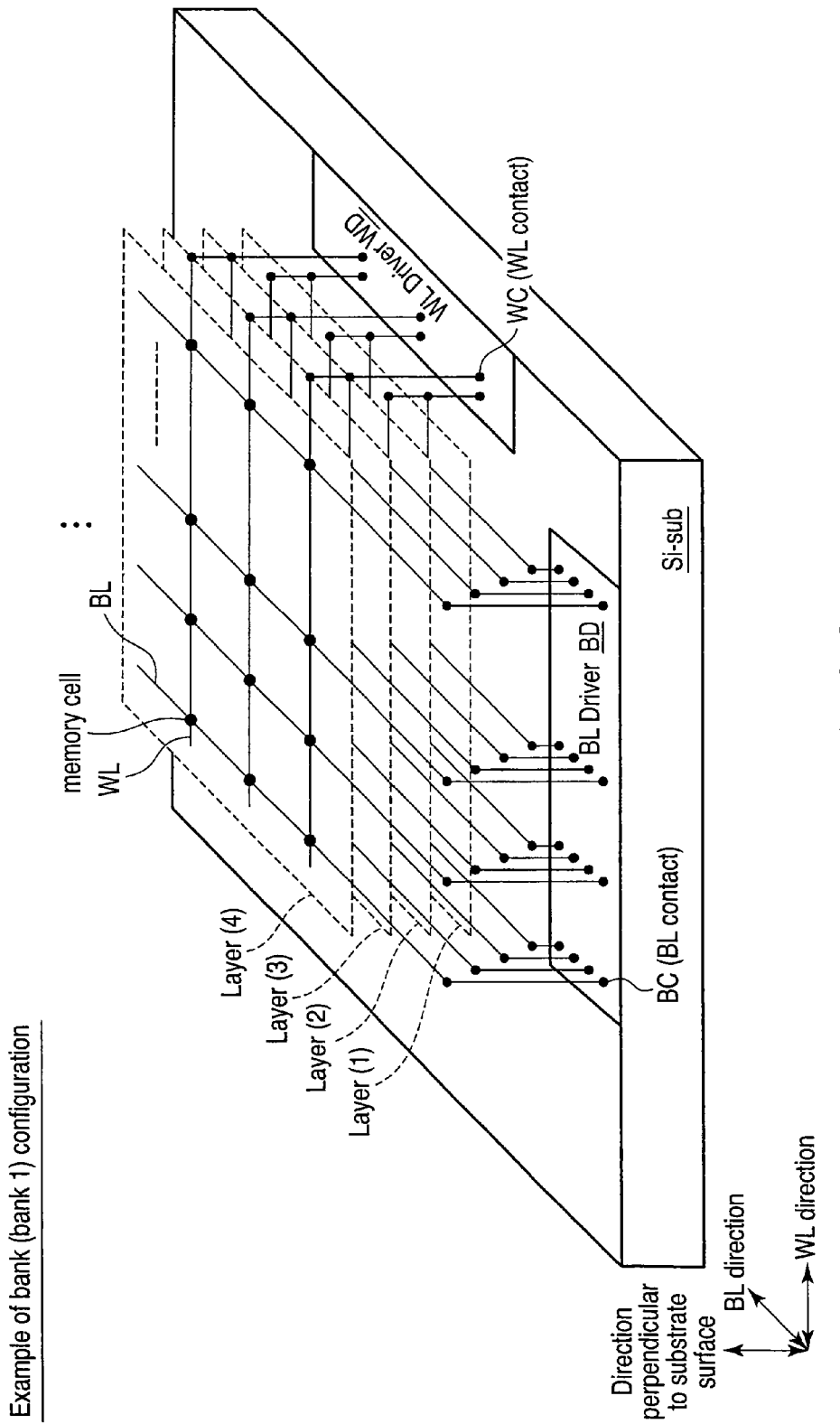
FIG. 2 is a perspective view showing an example of a configuration of a bank of the nonvolatile semiconductor memory device according to the first embodiment.

A memory cell array (core unit) 100 has at least two logical divisions including a plane 0 (100-1) and a plane 1 (100-2). Each of the plane 0 and the plane 1, as shown in FIG. 2 described later, is configured of a plurality of three-dimensionally arranged banks (bank 0, bank 1, . . . , bank n) each having a plurality of memory cells arranged at intersections of word lines and bit lines. An example of the nonvolatile semiconductor memory device according to this embodiment is shown to have a total of two banks. Nevertheless, the bank configuration or the plane configuration is not limited to the one shown in this embodiment.

An input buffer 101 has an input terminal connected to control pins (/CE pin, etc.) arranged in an interface of the nonvolatile semiconductor memory device and an output terminal of an input buffer 102. The input buffer 101 thus identifies IO-pin data input/output and a command, address and data from the control pins (/CE pin, etc.), and recognizes a state such as a write protection.

The input buffer 102, with an input connected to the IO pin, has an output connected to the input buffer 101, a command decoder 103, address buffers 104-1, 104-2 and a data buffer 105. This input buffer 102 is controlled by a signal from the input buffer 101. Data input to the input buffer 102 is distributed among the command decoder 103, the address buffers 104-1, 104-2 and the data buffer 105 in accordance with the state of the control pins (/CE pin, etc.).

The command decoder 103 interprets command data. Further, if required, the command decoder 103 activates a sequence control circuit 107.

The address buffer 104-1 is controlled by an output signal PROGCMD of the command decoder 103. Specifically, in the case where the output signal PROGCMD is activated with a write command input from an external source and an address received as required for the write operation, then the address buffer 104-1 receives the output signal of the input buffer 102.

Further, the address buffer 104-1 outputs a write address PADD[33:0] on the one hand, and outputs a signal PPLANE [1:0] indicating which is in write operation, the plane 0 or the plane 1, to the sequence control circuit 107 on the other hand. In the case where data is written in the plane 0, for example, a PPLANE[0] is activated, while in the case where data is written in the plane 1, a PPLANE[1] is activated. In the case where data is written in both of the planes, though described later, both the PPLANE[0] and the PPLANE[1] are activated.

The address buffer 104-2 is controlled by an output signal READCMD of the command decoder 103. Specifically, in the case where the output signal READCMD is activated with a read command input from an external source and an address ready to be received as required for the read operation, the address buffer 104-2 receives the output signal of the input buffer 102. In other words, the address buffer 104-1 is used for the write operation, and the address buffer 104-2 is used for the read operation.

Further, the address buffer 104-2 outputs a read address RADD[33:0] on the one hand, and outputs a signal RPLANE [1:0] indicating which is in read operation, the plane 0 or the plane 1, to the sequence control circuit 107. In the case where data is read from the plane 0, for example, a RPLANE[0] is activated, while in the case where data is read from the plane 1, a RPLANE[1] is activated. In the case where data is read from both of the planes, as described later, both the RPLANE [0] and the RPLANE[1] are activated.

The data buffer 105 temporarily holds and controls the write data input from the input buffer 102, and transmits it to a page register 110-1 or 110-2. Also, in data output mode, the data buffer 105 can stop the data output and avoid a conflict of data on an internal bidirectional data bus MDIO[7:0].

An output buffer 106-1, which reads the data from the memory cells and outputs memory cell ID information and the like, stops a drive of the I0-pin in other than the read operation.

An output buffer 106-2 is an output control circuit which informs external devices that the nonvolatile semiconductor memory device according to this embodiment is busy. In the ready state, i.e. in the state ready to receive the next command, for example, a RBx signal is activated, while in the busy state, i.e. in the state not ready to receive the next command, on the other hand, the RBx is deactivated.

The sequence control circuit 107 controls all the operations including the read, write and erase operations of the nonvolatile semiconductor memory device according to this embodiment. The control operations, for example, include the operation of issuing a signal for a required bias application to the memory cell array 100 and the operation of changing the value of the address register.

In response to the instruction from the sequence control circuit 107, array control circuits 108-1, 108-2, charge pump control circuits 109-1, 109-2 and the page register control circuits 110-1, 110-2 are activated. The suffix of each reference numeral indicates each plane for identification. For example, the suffix [0] is attached for the plane 0, and the suffix [1] for the plane 1.

The array control circuits 108-1, 108-2 perform the operation to control the application of the required bias to the memory cell array 100, to activate a sense amplifier arranged under the memory cell array 100 as described later and to control the operation of a register circuit, etc. Output signals of the array control circuits 108-1, 108-2 contain signals SAE[0], SAE[1] for activating the operation of the sense amplifier.

The charge pump control circuits 109-1, 109-2 apply a required source voltage to the memory cell 100 under the control of the sequence control circuit 107 and the array control circuits 108-1, 108-2.

The page register control (P.R. control) circuits 110-1, 110-2 according to this embodiment include page register circuits 110-1R, 110-2R, respectively, each having a resister of 1 kByte for the total of 2 kBytes. The detailed configuration of the page register circuits 110-1R, 110-2R is described later. The page register control circuits 110-1, 110-2 hold write data at the time of a data write operation, and hold a verification result during a verify operation to judge whether the write operation is correct or not. The page register control circuits 110-1, 110-2 also control data input/output to and from the sense amplifier circuit included in each plane (plane 0, plane 1). Further, the page register control circuits 110-1, 110-2 hold and sequentially send out a result of a data read operation to the I0x pin during the data read operation.

1-2 Example of Bank Configuration

Next, an example of the configuration of the banks composing each plane is explained with reference to FIG. 2. Take the bank 1 in the plane 0 as an example.

As shown in FIG. 2, the bank 1 has a plurality of layers (1) to (4) arranged in the direction perpendicular to a surface of a semiconductor substrate (Si-sub) and a bit line driver BD arranged on a surface region of the semiconductor substrate under the layers. A configuration under the layers is described later.

The plurality of the layers (1) to (4) have a plurality of memory cells arranged in matrix at the intersections between the word lines WL constituting column select lines and the bit lines BL constituting row select lines. An end of each bit line BL is connected electrically to the bit line driver BD through a bit line contact BC on the semiconductor substrate (Si-sub). An end of each word line WL, on the other hand, is connected electrically to the word line driver WD through a word line contact WC on the semiconductor substrate (Si-sub).

On the surface region of the semiconductor substrate under the layers (1) to (4), there are arranged, not shown here but described later, a sense amplifier circuit connected to the bit lines BL and various logic circuits including a register circuit for temporarily holding write data, in addition to a word line decoder WD and a bit line decoder BD.

Other banks are substantially similar to the bank 1 in configuration, and therefore, not described in detail here.

1-3 Example of Plane Configuration

Next, an example of the plane configuration is explained in more detail with reference to FIG. 3. Take the configuration of the plane 0 (100-1) as an example.

Figure 3:
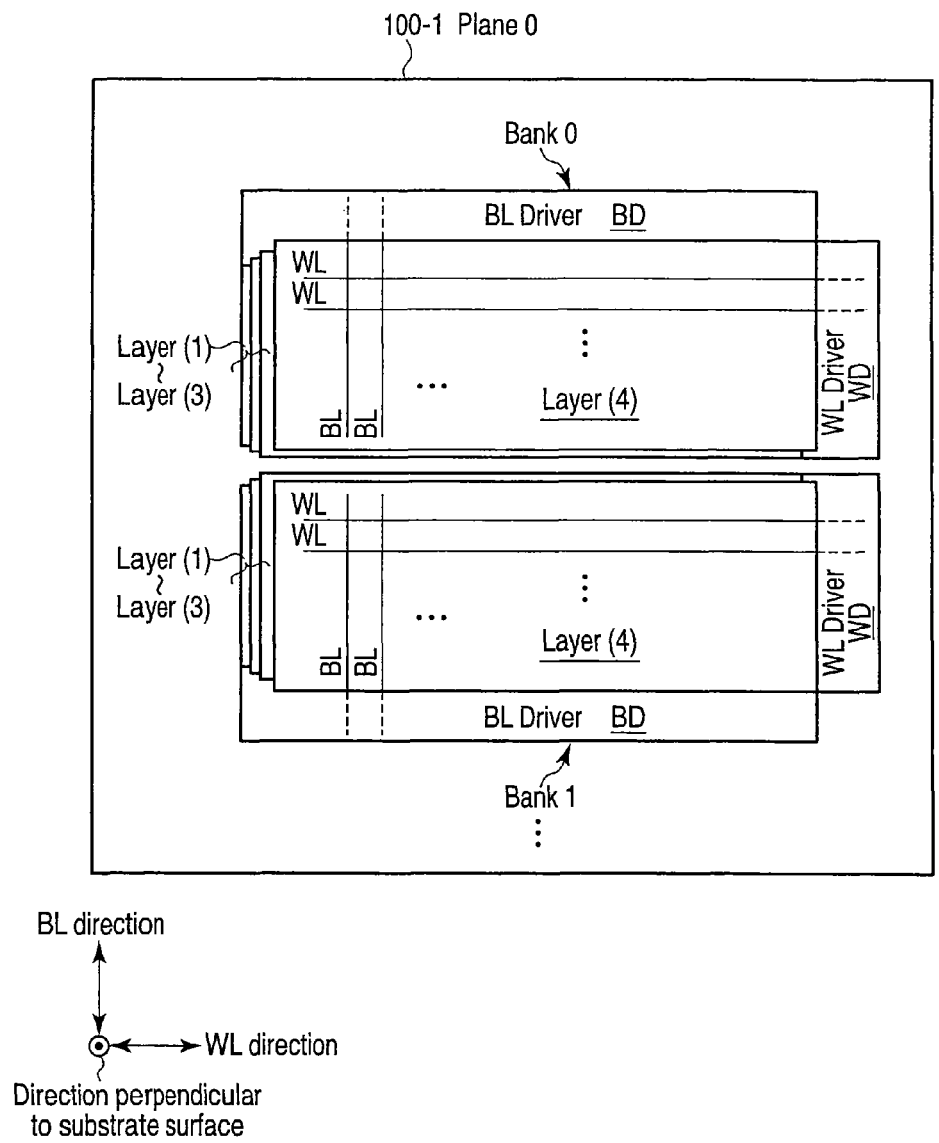
FIG. 3 is a plan view showing an example of a plane configuration of the nonvolatile semiconductor memory device according to the first embodiment.

As shown in FIG. 3, the plane 0 (100-1) has a plurality of the banks, for example, the banks 0 and 1. On the banks 0 and 1, the bit line driver BD, the word line driver WD, etc. are arranged in reflectional symmetry in the direction along the bit lines about the boundary between the word lines. Further, a plurality of banks more than two may be arranged similarly.

The other plane (plane 1) is substantially the same in configuration as the plane 0 and, therefore, not explained in detail. Incidentally, the planes, of which the aforementioned configuration is limited to FIG. 3 and the description thereof, are not necessarily reflectionally symmetric with each other, but may of course be arranged in other ways.

1-4 Example of Layer Configuration

Next, an example of the configuration of each layer is explained with reference to FIG. 4. Take the layer (1) as an example.

As shown in FIG. 4, a plurality of memory cells (M00 to M23) are arranged on the layer (1). In this exemplary arrangement, a total of 12 cells are formed of the four bit lines and the three word lines.

The plurality of the memory cells (M00 to M23) according to this example are each configured of a variable resistor 33 for storing an electrically rewritable resistance value as a data in nonvolatile fashion and a diode 34.

An end of a current path of the variable resistor 33 is connected to any of a plurality of word lines (WL to WLn+2), and the other end thereof to a cathode of the diode 34 through nodes n00 to n23. The variable resistor 33 is formed of, for example, a transition metal oxide.

An anode of the diode 34 is connected to any of a plurality of bit lines (BLn−1 to BLn+2).

Incidentally, each memory cell is not limited to the configuration shown in this example.

As shown in FIG. 5, for example, the diode 34 may be connected to the word line and the bit line in the opposite direction. Specifically, as an alternative, the anode of the diode 34 is connected to the other end of the current path of the variable resistor 33 through the node n01 and the cathode to the bit line BLn. As another alternative, the variable resistor may be inserted between the bit line and the anode of the diode with the diode and the variable resistor connected in the opposite direction.

As shown in FIG. 6, for example, the diode may be replaced by a switch transistor 35. Specifically, an end of a current path of the switch transistor 35 is connected to the other end of the variable resistor 33 through the node n01, and the other end of the current path is connected to the bit line BLn, so that the control signal C01 is input to the gate to control a conduction state of the current path.

In spite of the foregoing explanation about the configuration in which the independent bit line and the independent word line are arranged on each layer, the embodiment is not limited to this configuration. For example, at least one of the bit line and the word line may be shared by adjacent upper and lower layers.

1-5 Example of Configuration Under Layers

Next, an example of the configuration under the layers is explained with reference to FIG. 7.

Figure 7:
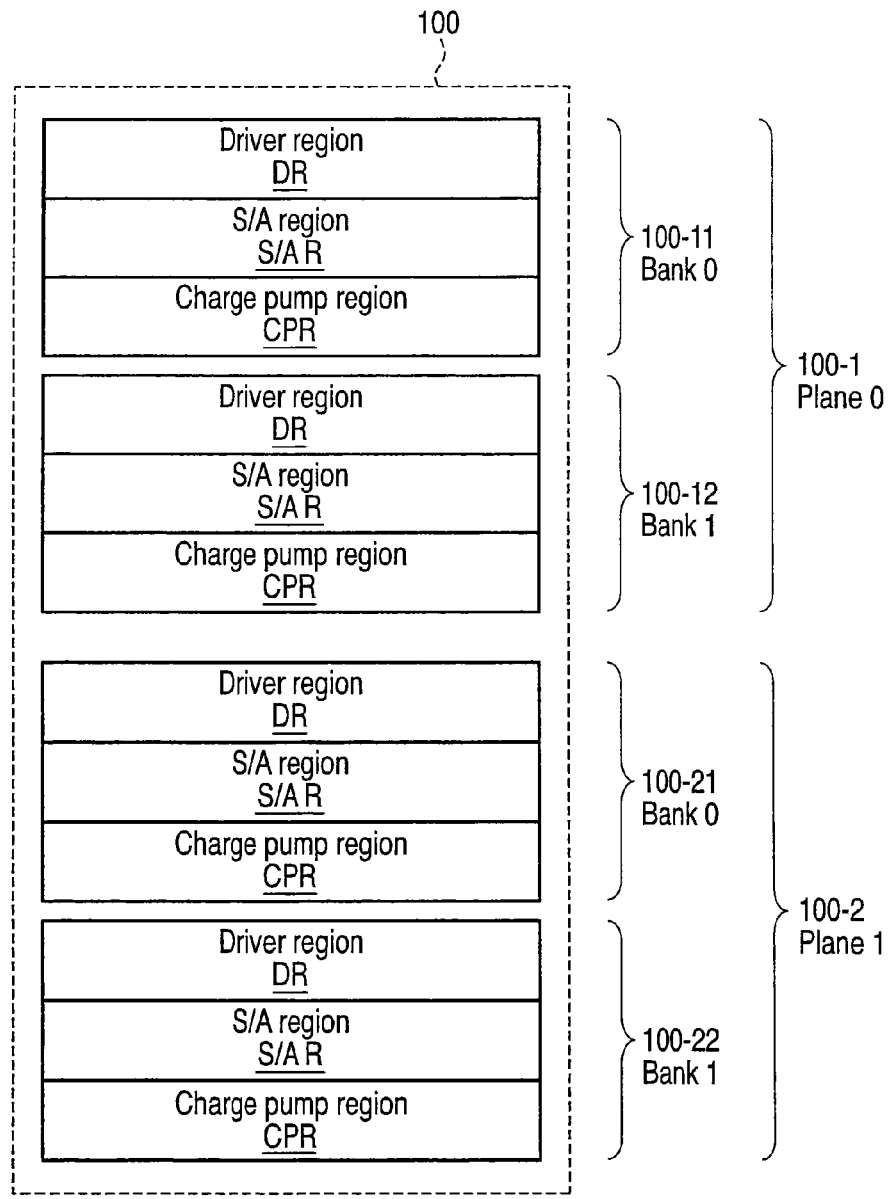
FIG. 7 is a block diagram showing an example of the configuration under the bank of the nonvolatile semiconductor memory device according to the first embodiment.

FIG. 7 is a block diagram schematically showing a circuit arrangement on the surface of the semiconductor substrate (Si-sub) under the three-dimensionally arranged layers (layers (1) to (4)) shown in FIG. 2.

As shown in FIG. 7, in the memory cell array 100 according to this example, in the absence of the memory cells arranged on the semiconductor substrate (Si-sub), various necessary circuits can be arranged under the layers (1) to (4) on the semiconductor substrate having the cell array thereon.

For example, the two planes 100-1 and 100-2 according to this embodiment each have two banks 100-11 to 100-22, and the surface region of the semiconductor substrate under the layer of each of the banks 100-11 to 100-22 has a driver region DR, a sense amplifier region S/AR and a charge pump region CPR.

The driver region DR has arranged therein, for example, the word line driver WD and the bit line driver BD.

The sense amplifier region S/AR (S/A region) has arranged therein a sense amplifier circuit to read by amplifying data of the memory cell read from the bit line.

The charge pump region CPR has arranged therein, for example, a charge pump circuit for boosting the source voltage and a voltage drop circuit used for the operation.

As a result, not only a capacity of the memory cell array 100 can be increased by the three-dimensional structure, but also the occupied spaced can be advantageously reduced.

Incidentally, the configuration under the layers is not necessarily limited to the aforementioned one, and can be appropriately changed.

1-6 Configuration Example of Page Register Circuit

Next, an example of the configuration of the page registers 110-1R, 110-2R of the page register control circuits 110-1, 110-2 is explained.

Figure 8:
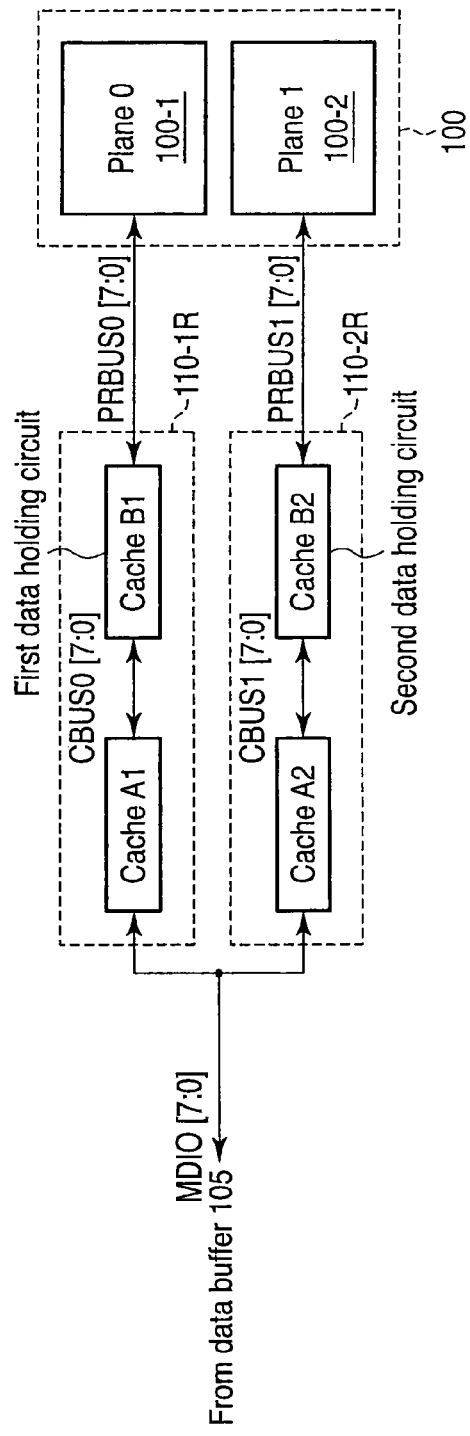
FIG. 8 is a block diagram showing an example of a configuration of a page register of the nonvolatile semiconductor memory device according to the first embodiment.

As described above, the page register control circuits 110-1, 110-2, each having the register space of 1 kByte, can be configured as a double buffer shown in FIG. 8 as required.

The page register circuit 110-1R has a cache A1 and a cache B1. The cache A1 having the capacity of 1 kByte has an input thereof connected to a bidirectional bus MDI0[7:0] connected to the data buffer 105 and an output thereof connected to an input of the cache B1 through the bus CBUS0 [7:0]. The cache B1 (first data holding circuit), having the capacity of 1 kByte, on the other hand, has an output thereof connected to the plane 0 (first portion) of the memory cell array through a bus (first bus: PRSUS0[7:0]).

The page register circuit 110-2R has a cache A2 and a cache B2. The cache A2, having the capacity of 1 kByte, has an input thereof connected to the bidirectional bus MDI0[7:0] connected to the data buffer 105 and an output thereof connected to an input of the cache B2 through the bus CBUS1 [7:0]. The cache B2 (second data holding circuit), having the capacity of 1 kByte, on the other hand, has an output thereof connected to the plane 1 (second portion) of the memory cell array through a bus (second bus: PRSUS1[7:0]).

The double buffer configuration according to this embodiment works effectively for a cache program operation of a plurality of continuously programmed 1-kByte pages in which program data of a given page is input during a program operation of the preceding page. The detail of this configuration is explained later.

1-7 Example of Cache (Data Holding Circuit) Configuration

Next, an example of the configuration of the caches A1 to B2 of the page registers 110-1R, 110-2R is explained with reference to FIG. 9. Take the configuration of the cache A1 of the page register 110-1R as an example. Incidentally, the cache configuration is not limited to this embodiment and any other configuration may of course be employed as far as a similar function can be realized.

Figure 9:
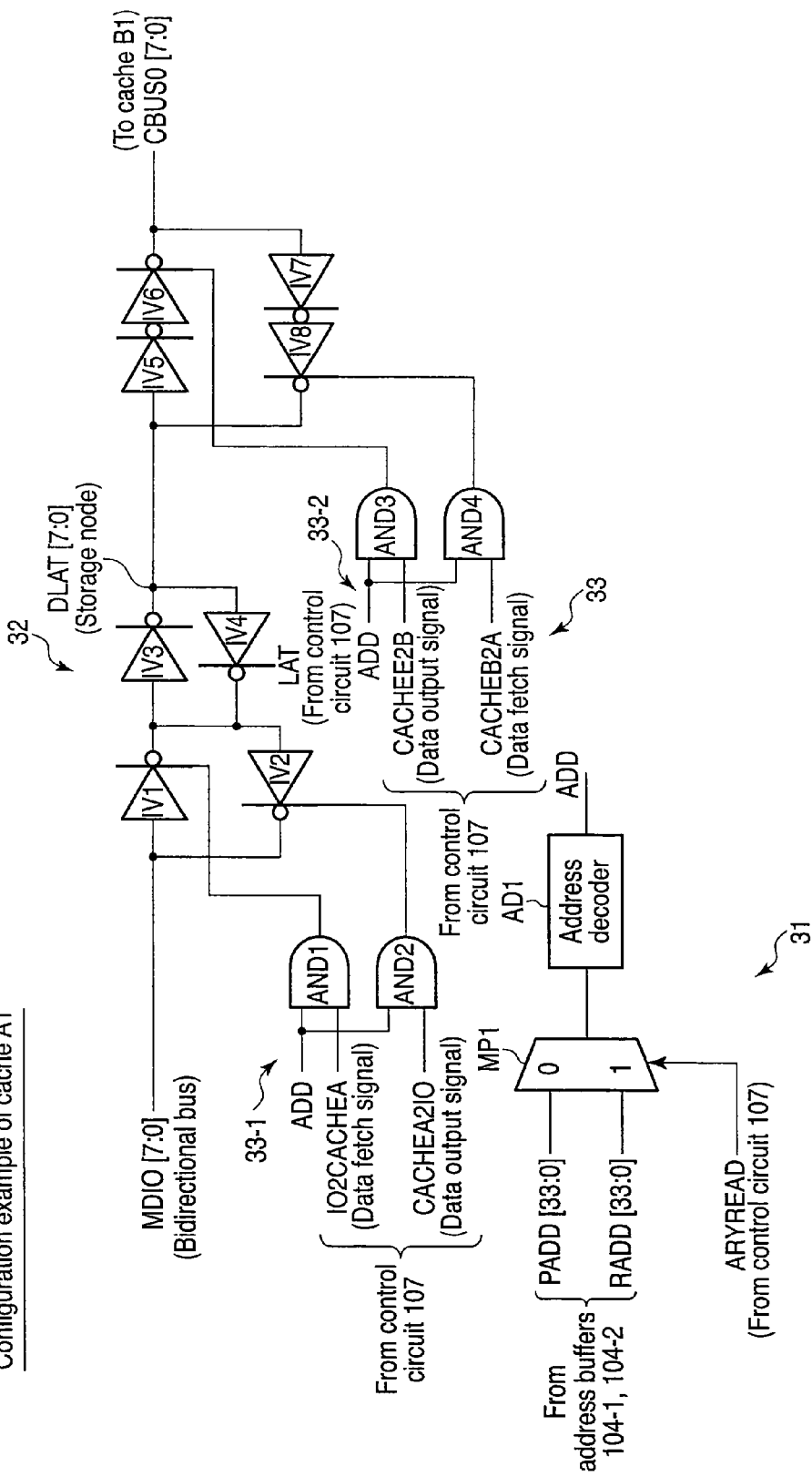
FIG. 9 is an equivalent circuit diagram showing an example of a configuration of a cache circuit in FIG. 8.

According to this embodiment, the configuration shown in FIG. 9 is taken as an example required for the cache A1. Specifically, the cache A1 includes an address decoder 31, a data input/output unit 32 and a data input/output control unit 33.

The address decoder 31 is included to generate an address signal ADD within the page register circuits 110-1R, 110-2R, and therefore, not necessarily limited to the configuration shown in this embodiment.

The address decoder 31 includes a select circuit MP1 for selectively retrieving the input write address signal PADD [33:0] or the input read address signal RADD[33:0] in accordance with a signal ARYREAD[0] or ARYREAD[1] indicating that the plane input from the sequence control circuit 107 is in the read operation, and a decode circuit (address decoder) AD1 for decoding an output of the select circuit MP1 to check whether the address of a particular cache is selected or not.

In the data input/output unit 32, the data on the bidirectional bus MDIO[7:0] from the data buffer circuit 105 is input/output in units of data in the cache (normally one byte) indicated by an address signal line ADD not shown. The data input/output unit 32 includes inverters IV1 to IV8.

The inverter IV1 has an input thereof connected to the bidirectional bus MDIO[7:0] and an output thereof connected to an input of the inverter IV2. A control terminal of the inverter IV1 is connected to an output of an AND circuit AND1 of a first data input/output control circuit 33-1. The inverter IV2 has an output thereof connected to the input of the inverter IV1 and a control terminal thereof connected to an output of an AND circuit AND2 of the first data input/output control circuit 33-1.

The inverter IV3 has an input thereof connected to the output of the inverter IV1, and an output thereof connected to an input of a storage node DLAT[7:0] and the inverter IV4. The inverter IV4 has an output thereof connected to the input of the inverter IV3, and a control terminal thereof supplied with a data latch control signal LAT output from the control circuit 107 not shown. The storage node DLAT[7:0] is for holding data. The bidirectional bus CBUS0[7:0] is for connecting the cache A1 and the cache B1 in two ways.

The inverters IV5, IV6 have an input and output thereof connected in series to each other between the storage node DLAT[7:0] and the bidirectional bus CBUS0[7:0], and a control terminal of the inverter IV6 is connected to the output of an AND circuit AND3 of a second data input/output control circuit 33-2. The inverters IV7, IV8 have an input and output thereof connected in series to each other between the bidirectional bus CBUS0[7:0] and the input of the storage node DLAT[7:0], and a control terminal of the inverter IV8 is connected to an output of an AND circuit AND4 of the second data input/output control circuit 33-2.

The data input/output control unit 33 includes the first and second data input/output control circuits 33-1, 33-2.

The first data input/output control circuit 33-1 includes the AND circuit AND1 supplied with a signal I02CACHEA for instructing the cache A1 to fetch the data from the IO side, and the AND circuit AND2 supplied with a signal CACHE2IO for instructing an output buffer 106-1 to output the data from the cache A1. The input terminal of the AND circuit AND1 is further supplied with the address signal ADD. The AND circuit AND2, like the AND circuit AND1, is also supplied with the address signal ADD. The first data input/output control circuit 33-1 having this configuration determines whether the data of the bus MDI0[7:0] is to be fetched into the storage node DLAT[7:0] or the data of the storage node DLAT[7:0] is to be output to the bus MDI0[7:0].

The second data input/output control circuit 33-2 includes the AND circuit AND3 supplied with a signal CACHEA2B for instructing data to be output to the cache B1 and the AND circuit AND4 supplied with a signal CAHCEB2A for instructing data to be fetched from the cache B1. The input terminal of the AND circuit AND3 is further supplied with the address signal ADD. The input terminal of the AND circuit AND4, like the AND circuit AND3, is also supplied with the address signal ADD. The second data input/output control circuit 33-2 having this configuration determines whether the data of the storage node DLAT[7:0] is to be output to the bidirectional bus CBUS0[7:0] or the data of the bidirectional bus CBUS0[7:0] is to be fetched into the storage node DLAT [7:0].

Each configuration of the other caches A2, B1 and B2 is substantially similar to that of the cache A1 described above, and therefore, not described in detail. The circuit of the cache A1 may be either shared with the cache B2 or arranged externally of the page register circuit 110-1R.

<2. Data Write, Erase and Read Operation>

Figure 10:
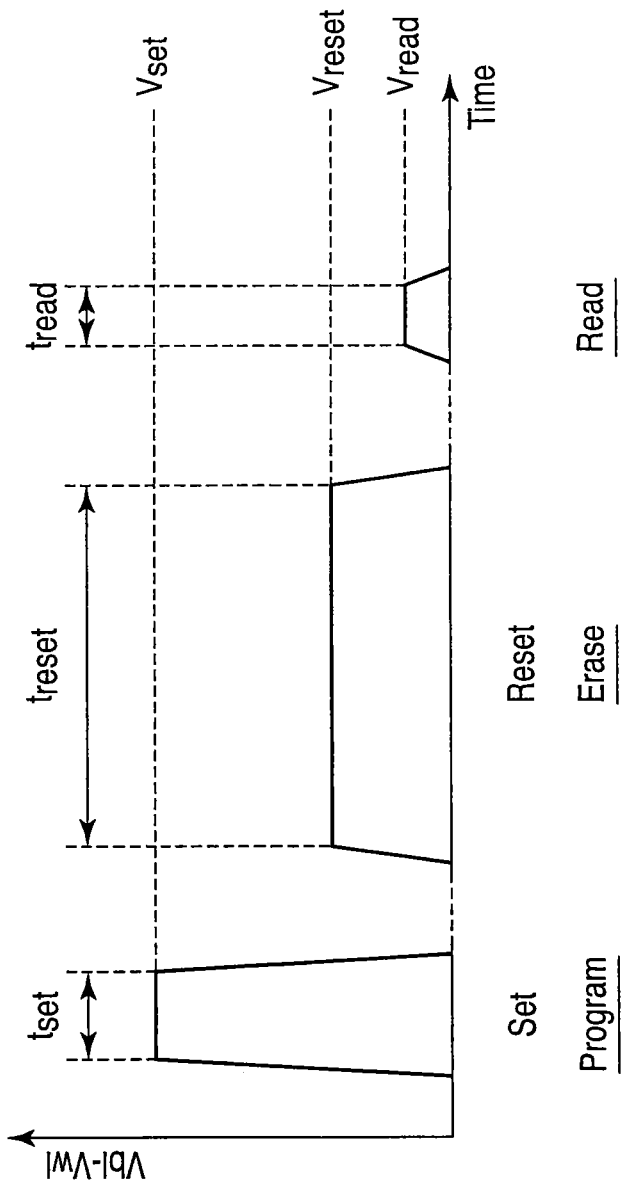
FIG. 10 is a diagram showing a relation between time and voltage in data write, erase and read operations of the nonvolatile semiconductor memory device according to the first embodiment.

Next, each operation of writing, erasing and reading data in the nonvolatile semiconductor memory device according to this embodiment is explained with reference to FIG. 10. FIG. 10 schematically shows relative magnitudes of a voltage applied to the memory cell array and a time in each of program (set), erase (reset) and read operations.

<Data Write (Program (Set)) Operation>

First, the operation of writing data in the memory cell is briefly explained.

In order to write data, a voltage is applied to the selected variable resistor 33 of the memory cell and, by thus generating a potential gradient, a current is rendered to flow in the selected variable resistor 33.

For example, a state is created in which a potential of the word line WL is lower than a potential of the bit line BL. As illustrated in FIG. 10, a ground potential is applied to the word line WL and the write voltage (Vset) is applied to the bit line BL during the time tset.

Incidentally, during this data write operation, the unselected word lines WL and the unselected bit lines BL are desirably biased to suppress an erroneous write or erase operation or an useless current path. Also, during the standby period before the data write operation, all the word lines WL and the bit lines BL are desirably precharged. Also, the voltage to be applied for recording information may be generated by creating a state in which the bit line BL is higher in potential than the word line WL.

<Data Erase (Reset) Operation>

The data erase operation is performed by Joule heating the selected variable resistor 33 with a current pulse and thus promoting an oxidation-reduction reaction in the variable resistor 33.

For example, as illustrated in FIG. 10, the erase voltage (Vreset) is applied between the word line WL and the bit line BL during the time treset.

<Data Read Operation>

The data read operation is performed by applying, for example, a voltage pulse to the selected variable resistor 33 and detecting the current determined by a resistance of the corresponding memory cell. This voltage is desirably as small in amplitude as not to change a state of a material making up the variable resistor 33. Then, the read voltage is applied to the selected memory cell from the bit line BL and the resulting current value is measured by the sense amplifier S/A.

As illustrated in FIG. 10, for example, the read voltage (Vread) is applied to the selected memory cell from the bit line BL during the time tread.

As described above, according to this embodiment, the relation holds that "time tread<time tset<time treset", and at the same time, "write voltage Vset>erase voltage Vreset>read voltage Vread". Nevertheless, the embodiment is not limited to this relation and can appropriately employ a different relation as required.

<3. Control Operation>

Next, the control operation of the nonvolatile semiconductor memory device according to this embodiment is explained with reference to FIG. 11. According to this embodiment, an example is taken in which the operation of writing data of 1 kByte in the plane 0 (100-1) is performed concurrently with the operation of reading data of 1 kByte from the plane 1 (100-2). Though not shown, a host device connected to the nonvolatile semiconductor memory device issues a write command and the like to the nonvolatile semiconductor memory device.

First, assume that a start command cmd1 required for providing a data write address and write data is input to the plane 0 at a time t0. Plane addresses (plane 0 addresses) add1 to add5 are input, followed by the write data (1 kByte (max)).

Once the data write command is issued for the plane 0, the address buffer 104-1 shown in FIG. 1 receives and holds the write address, while at the same time activating the signal PPLANE[0] indicating that the plane 0 is in write operation. The write data input following the plane addresses is stored in the cache A1.

After that, upon application of a program start command cmd2 to start the write operation from the host device at a time t1, the nonvolatile semiconductor memory device starts the operation of writing data in the plane 0.

Figure 11:
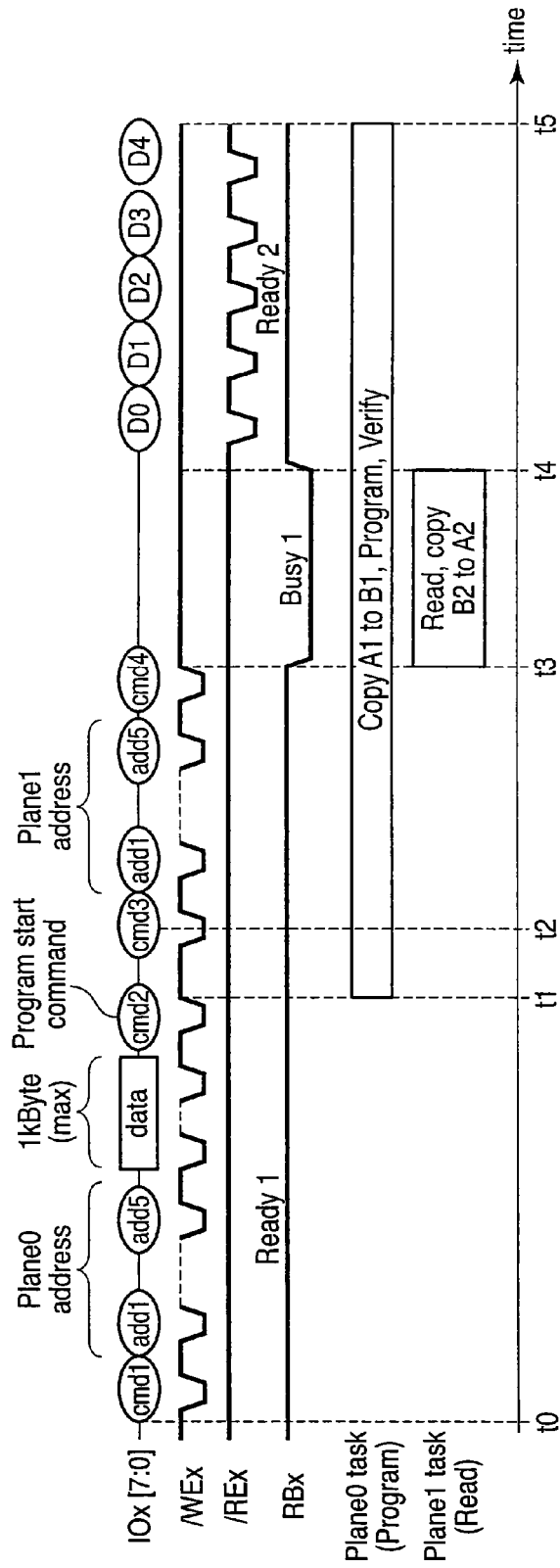
FIG. 11 is a control sequence chart showing a control operation of the nonvolatile semiconductor memory device according to the first embodiment.

In this example, the data write operation in the plane 0 is represented by the description "task" in FIG. 11. The description "task" includes a boosting of the voltage required for the write operation, a data copying between the caches (copy A1 to B1), an application of a program pulse to the memory cells (program) and a write verifying.

According to this embodiment, even during the data write operation in the plane 0, the data read operation can be performed by driving the cache A2 including the cache B2 connected to the plane 1.

Specifically, at a time t2, read addresses (plane 1 addresses) add1 to add5 are input following a permit command cmd3 to permit the read address input. In the process, the address specifying the data read operation designates a plane different from the plane 0 (100-1) in which the data write operation is going on.

Then, at a time t3 when a read operation command cmd4 is input, the data read operation for the plane 1 (plane 1 task (read)) is performed concurrently with the data write operation (program) already going on for the plane 0. In this case, the description "plane 1 task (read)" indicating the data read operation for the plane 1 shown in FIG. 11 includes a boosting or reducing of a voltage required for the data read operation, an application of a read pulse to the memory cells (read), a data sensing and a data copying between the caches (copy B2 to A2). By this time, the nonvolatile semiconductor memory device assumes an "H" state (ready state (ready 1)) with the RBx pin activated, and informs the external host device of the ready state.

During the subsequent period (time t3 to time t4) when the data read operation and the data write operation in the planes 0 and 1 are temporally overlapped, however, the nonvolatile semiconductor memory device assumes a busy state with the RBx pin deactivated ("L" state (busy 1)) and informs the external host device of the busy state.

Assume that the data read operation for the plane 1 is finished and the read data stored in the cache A2 in full preparation at a time t4. The RBx pin assumes the "H" state (ready state (ready 2)) indicating the activation of the RBx pin again, and the external host device is informed of the ready state.

Then, while a read enable signal /REx is in toggle mode, read data D0 to D4 are sequentially output externally from the I0x pin.

At a time t5, the data write operation for the plane 0 is finished, and the control operation according to this embodiment completed. Incidentally, although the operation is shown as completed in FIG. 11, the read operation for the plane 1 may be actually continued regardless of whether the internal write operation is finished or not.

<4. Operational Effects>

The nonvolatile semiconductor memory device according to this embodiment and the control method thereof can achieve at least the effects described in (1) and (2) below.

(1) The operation speed can be advantageously increased.

As described above, the nonvolatile semiconductor memory device according to this embodiment comprises the memory cell array 100 composed of at least first and second portions (100-1, 100-2) each including a plurality of the memory cells (M00 to M23) each having the variable resistor 33 for storing an electrically rewritable resistance value as a data, and the control circuit (sequence control) 107 for controlling the erase, write and read operations for the memory cell array 100 in such a manner as to temporally overlap (time t3 to time t4; busy 1) the first operation (plane-0 task (program)) including any one of the data erase, write and read operations for the first portion (plane 0 (100-1)) and the second operation (plane 1 task (read)) including any one of the data erase, write and read operations for the second portion (plane 1 (100-1)).

More specifically, the nonvolatile semiconductor memory device according to this embodiment comprises the page register circuits 110-1R, 110-2R including the cache B1 (first data holding circuit) connected to the plane 100-1, as one of logically divided two different planes, through a bidirectional bus PRBUS0[7:0] and the cache B2 (second data holding circuit) connected to the plane 100-2 through a bidirectional bus PRBUS1[7:0] on the one hand, and the page register control circuits 110-1, 110-2 including the array control circuit, the charge pump control circuit and the caches A1, A2 independent for each plane on the other hand. The page register control circuits 110-1, 110-2 permit the data write and read operations to be performed for the planes 100-1, 100-2 concurrently in at least temporally overlapped relation under the control of the control circuit 107.

In the nonvolatile semiconductor memory device according to this embodiment, therefore, the data read operation, if required during the data write or erase operation, can be performed without waiting for the completion of the data write or erase operation, whichever may be going on. Thus, the data processing speed can be increased by the fact that the data write and read operations can concurrently performed in temporally overlapped fashion for the planes 100-1 and 100-2. Especially, according to this embodiment, in spite of the fact that the data write or erase operation consumes a longer time than the data read operation, these operations can be performed in temporally overlapped relation with each other. As a result, it is apparent that the performance of the system as a whole is not deteriorated.

As described later, the concurrent operations performed in temporally overlapped fashion for the planes 100-1, 100-2 are not limited to the data write and read operations. Instead of the data write operation, for example, a combination of the data erase and read operations or a combination of the same type of operations such as the data write operation can be similarly performed for the planes 100-1, 100-2 with equal effect. According to this embodiment, the planes 100-1, 100-2 each have the different control circuits 110-1, 110-2, and therefore, the same type of the operation can be executed in the planes 100-1, 100-2. Further, instead of performing the operation at a different timing for each plane, the nonvolatile semiconductor memory device can be operated as a device having a virtual page length of, say, 2 kBytes.

Also, the charge pump circuit CP configured on the semiconductor substrate (Si-sub) under the three-dimensionally arranged memory cells may be operated with the planes in such a manner that a write voltage is generated in the case where one plane 100-1 is in the data write operation while a read voltage is generated or the operation of the charge pump circuit CP is stopped in the case where the other plane 100-2 is in the data read operation.

Although this embodiment represents an application in which the address buffer 104-1 is limited to the write operation and the address buffer 104-2 to the read operation, the embodiment is not limited to such application. For example, this configuration may be so expanded that the address buffer 104-1 is used for the first operation (the data write, erase or read operation) already started and the address buffer 104-2 for the second operation (the data write, erase or read operation).

(2) The capacity can be increased and the occupied area reduced advantageously.

The memory cell array 100 according to this embodiment includes a plurality of the layers (layers (1) to (4) each having memory cells and three-dimensionally arranged in the direction perpendicular to the surface of the semiconductor substrate (Si-sub). Further, as shown in FIG. 7, the driver circuit, etc. can be arranged in the space under the plurality of the layers on the surface area of the semiconductor substrate (Si-sub).

For example, the two planes 100-1, 100-2 according to this embodiment are each configured of the two banks for the total of the four banks 100-11 to 100-22 in each of which the driver region DR, the sense amplifier region S/AR and the charge pump region CPR are formed on the surface area of the semiconductor substrate under the layers of each of the banks 100-11 to 100-22.

The word line driver WD, the bit line driver BD, etc. described above, for example, are arranged in the driver region DR. The sense amplifier circuit, etc. for amplifying and reading the memory cell data read from the bit line are arranged in the sense amplifier region (S/A region) S/AR. Also, the charge pump circuit for boosting a source voltage, the voltage drop circuit, etc. used at the time of the data write operation are arranged in the charge pump region CPR.

Advantageously, therefore, not only the capacity is increased by the three-dimensional structure of the memory cell array 100 but also the occupied space is reduced.

[Second Embodiment (Example Having a Shared Cache Circuit)]

Next, the nonvolatile semiconductor memory device according to a second embodiment and a control operation thereof are explained with reference to FIGS. 12 to 14. This embodiment represents a case in which a cache circuit 111 is shared by the page register control circuits 110-1, 110-2. In the explanation that follows, the component parts similar to the corresponding ones of the first embodiment are not described in detail.

<Configuration Example>

General Configuration:

First, an example of a general configuration of the nonvolatile semiconductor memory device according to this embodiment is explained with reference to FIG. 12.

According to the first embodiment described above, each of the planes 100-1, 100-2 has the corresponding one of the page register control circuits 110-1, 110-2 of a similar configuration including the cache circuits (A1, A2, B1, B2).

Figure 12:
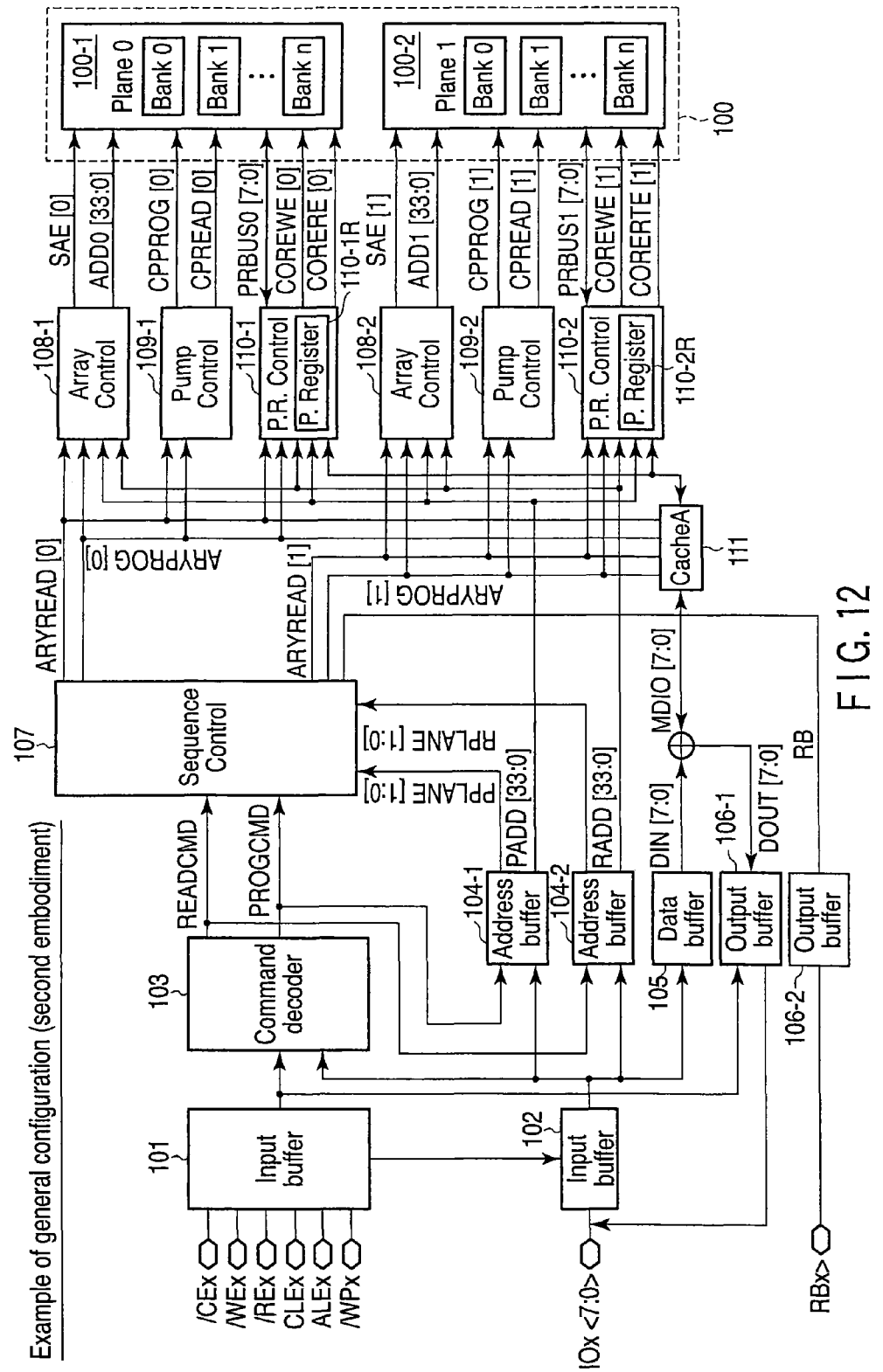
FIG. 12 is a block diagram showing a nonvolatile semiconductor memory device according to a second embodiment.

The configuration according to this embodiment, however, is different from that of the first embodiment in that, as shown in FIG. 12, the page register control circuits 110-1, 110-2 share the cache circuit 111. A specific configuration of the cache circuit 111 is described later.

According to this embodiment, therefore, the caches A1, A2 can be shared by the planes 100-1, 100-2, thereby further reducing the occupied space advantageously for micronization.

Configuration Example of Common Cache Circuit 111:

Next, an example of the configuration of the common cache circuit 111 according to this embodiment is explained with reference to FIG. 13.

Figure 13:
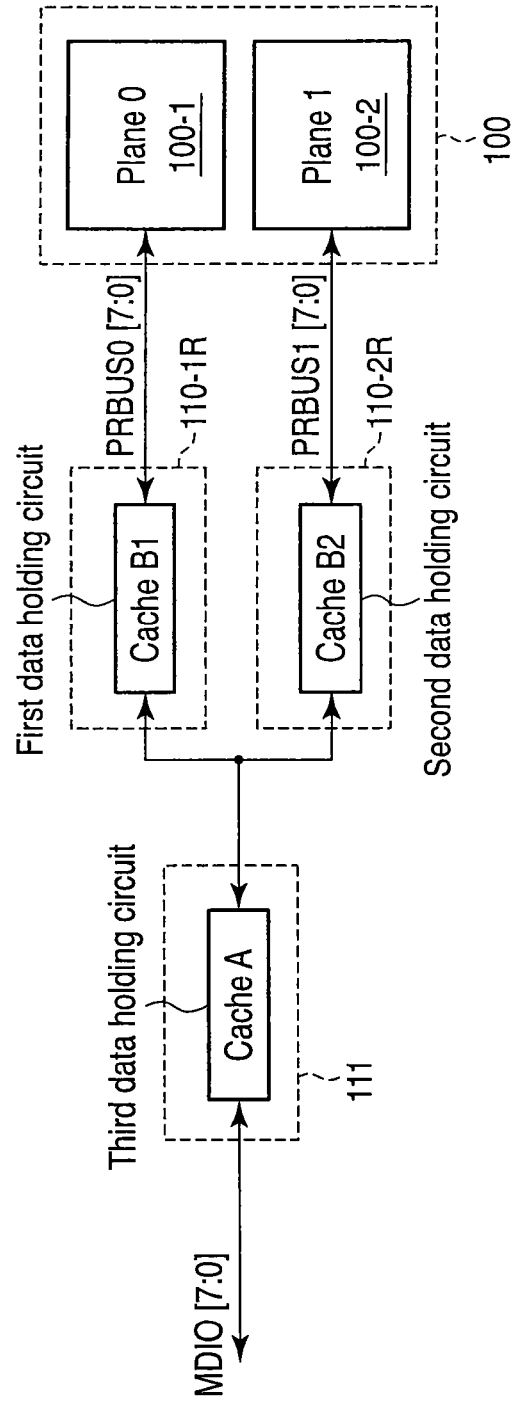
FIG. 13 is a block diagram showing an example of a configuration of a page register of the nonvolatile semiconductor memory device according to the second embodiment.
Figure 14:
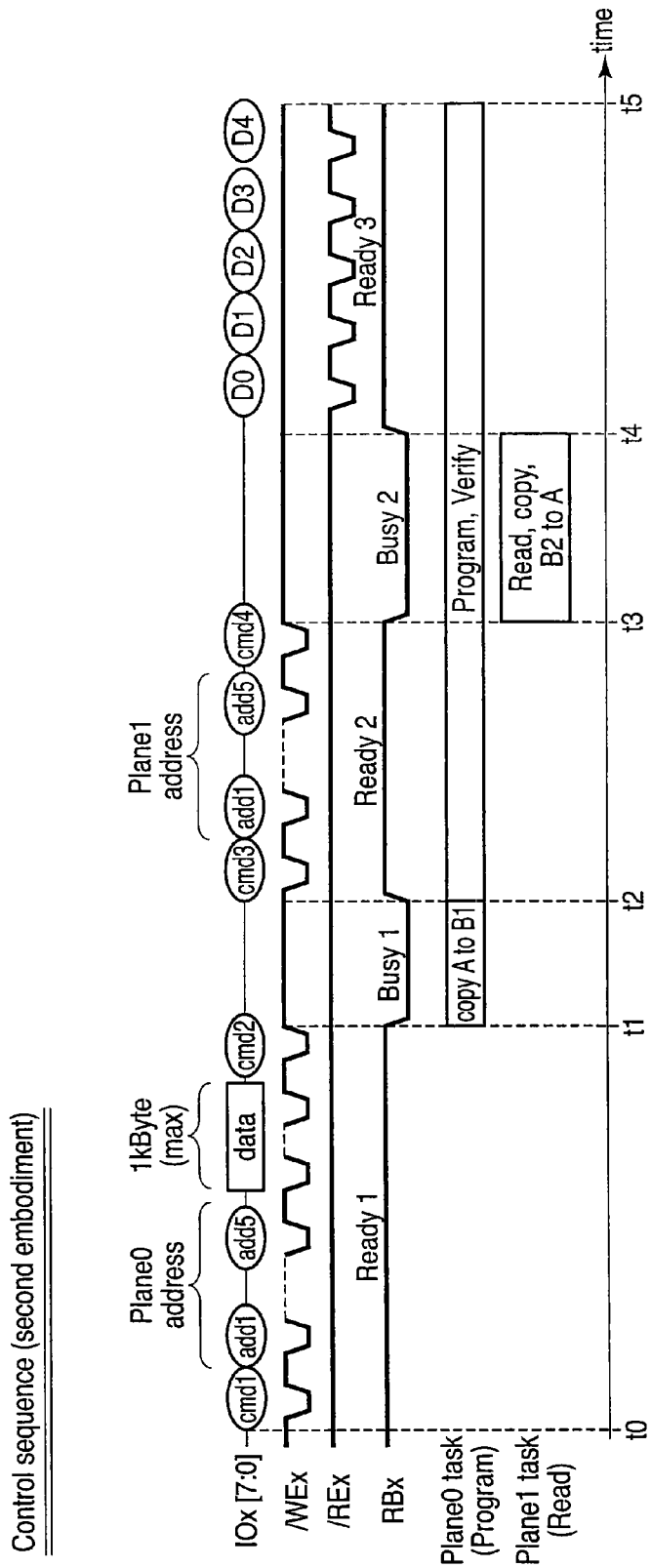
FIG. 14 is a control sequence chart showing a control operation of the nonvolatile semiconductor memory device according to the second embodiment.

As shown in FIG. 13, the cache B1 (first data holding circuit) of the page register circuit 110-1R and the cache B2 (second data holding circuit) of the page register circuit 110-2R are arranged for the planes 1 and 0 (100-1, 100-2), respectively, while the cache A (third data holding circuit) of the common cache circuit 111 is shared by the planes 1 and 0 (100-1, 100-2).

An output and an input of the cache A (third data holding circuit) are connected between the bus MDIO[7:0] and the caches B1, B2.

Assuming that the caches B1 and B2 each have a capacity of 1 kByte, for example, the cache A is required to have a capacity of at least 1 kByte or more, and can maintain a sufficient performance with, say, about 2 kBytes.

<Control Operation>

Next, the control operation of the nonvolatile semiconductor memory device according to this embodiment is explained with reference to FIG. 14. According to this embodiment, an example is taken in which the operation of writing data of 1 kByte in the plane 0 (100-1) is performed concurrently with the operation of reading data of 1 kByte from the plane 1 (100-2). Though not shown, the host device connected to the nonvolatile semiconductor memory device issues a write command, etc. to the nonvolatile semiconductor memory device.

First, assume that the start command cmd1 required for providing a data write address and write data to the plane 0 is input at a time t0. Plane addresses (plane 0 addresses) add1 to add5 are input, followed by the write data (1 kByte (max)).

Once the data write command is issued for the plane 0, the address buffer 104-1 shown in FIG. 12 receives and holds the write address, while at the same time activating the signal PPLANE[0] indicating that plane 0 is in write operation.

The write data input following the plane addresses is stored in the cache A of the common cache circuit 111. By this time, the nonvolatile semiconductor memory device assumes an "H" state (ready state (ready 1)) with the RBx pin activated, and informs the external host device of the ready state.

At the next time t1 when the command cmd2 to start the data write operation is supplied from the external host device, the write data is copied from the cache A to the second data holding circuit (the cache B1 in the case under consideration) (copy A to B1) corresponding to the plane (plane 0 in the case under consideration) associated with the write address.

In the process, i.e. during the period when the write data copy operation (copy A to B1) is performed (time t1 to time t2), the nonvolatile semiconductor memory device assumes a busy state with the RBx pin deactivated ("L" state (busy 1)) and informs the external host device of the busy state. As a result, the external host device can be informed that the next command such as a read command cannot be accepted.

Then, at a time t2 when a program start command cmd3 is input, the data write operation in the plane 0 is continued (plane 0 task (program)). Like in the aforementioned case, the description "task" as the data write operation in the plane 0 in FIG. 14 includes the boosting of the voltage required for the data write operation, the application of the program pulse to the memory cells (program) and the write verifying.

In the process, the cache A, upon completion of the operation of copying the write data from the cache A to the cache B1, notifies the availability thereof for another application. Specifically, the nonvolatile semiconductor memory device notifies the external host device that it is in ready state as the RBx pin is activated to the "H" state (ready state (ready 2)).

As long as this write operation is performed in the plane 0, the data read operation can be concurrently carried out in temporally overlapped fashion using the cache B2 connected to the plane 1 and the cache A available for use.

Specifically, the read addresses (plane 1 addresses) add1 to add5 are input following the permit command cmd3 to permit the read address input. In the process, the address specifying the data read operation designates a plane different from the plane 0 (100-1) in which the data write operation is going on.

Then, at a time t3 when the read operation command cmd4 is input, the data read operation for the plane 1 (plane 1 task (read)) is performed concurrently with the data write operation (program) already going on for the plane 0. The description "plane 1 task (read)" indicating the data read operation for the plane 1 in FIG. 14 includes the boosting or reducing of the voltage required for the data read operation, the application of the read pulse to the memory cells, the data sensing and the data copying between the caches (copy B2 to A).

In this process, i.e. during the period (time t3 to time t4) when the data read operation and the data write operation in the planes 0 and 1 are temporally overlapped, the nonvolatile semiconductor memory device assumes a busy state with the RBx pin deactivated ("L" state (busy 2)) and informs the external host device of the busy state.

Assume that the data read operation for the plane 1 is finished and the read data stored in the cache A in full preparation at a time t4. The RBx pin assumes the "H" state (ready state (ready 3)) indicating the activation of the RBx pin again, and the external host device is informed of the ready state.

Then, while the read enable signal /REx is in toggle mode, read data D0 to D4 are sequentially output externally from the I0x pin.

At time point t5, the data write operation for the plane 0 is finished, and the control operation according to this embodiment is completed. Incidentally, in spite of the apparent completion of the operation in the drawing, the read operation for the plane 1 may be actually continued regardless of whether the internal write operation is finished or not.

<Operational Effects>

As described above, the nonvolatile semiconductor memory device according to the second embodiment and the control method thereof achieve the effects at least similar to the effects (1) and (2) described above. Further, according to this embodiment, the effect (3) described below is achieved.

(3) The occupied space can be further reduced advantageously for micronization.

This embodiment is different in configuration from the first embodiment in that according to this embodiment, the common cache circuit 111 is shared by the page register control circuits 110-1, 110-2.

According to this embodiment, therefore, the caches A1, A2 can be shared by the planes 100-1, 100-2. Thus, the occupied space can be further reduced and the micronization achieved advantageously.

[Modification (Other Control Operations)]

Next, the nonvolatile semiconductor memory device according to a modification is explained with reference to FIG. 15. This modification concerns other control operations. In the description that follows, the same component elements as those in the first and second embodiments described above are not explained in detail again.

FIG. 15 shows the operation adapted to be carried out concurrently in temporally overlapped fashion for the planes 0 and 1 with the configuration and the control operation explained above.

In FIG. 15, the control operation designated by mark ⊙ is explained in detail already in the first and second embodiments. Specifically, the data write operation (program) for the plane 0 and the data read operation for the plane 1 can be controlled concurrently in temporally overlapped relation with each other.

In FIG. 15, the control operation indicated by mark "∘", though not explained in detail in the first and second embodiments, can be similarly carried out. For example, the mark "∘" indicates that the data write operation (program) for the plane 0 and the data write operation (program) for the plane 1 can be controlled concurrently in temporally overlapped relation with each other.

As described above, with the configuration and the control operation according to this embodiment, all the operations including the data write operation, the data erase operation and the data read operation or any combination thereof can be concurrently carried out in temporally overlapped fashion in a plurality of the planes.

The nonvolatile semiconductor memory device for writing, erasing or reading data by page normally requires task scheduling to wait for completion of operation in units of a page. With the configuration and the control operation of the nonvolatile semiconductor memory device according to this embodiment, however, a high operation speed can be achieved advantageously by the fact that two different types of operations can be concurrently performed in temporally overlapped fashion.

[Third Embodiment (Example Including Common Cache Circuit)]

Next, a nonvolatile semiconductor memory device according to a third embodiment and the control operation thereof are explained with reference to FIGS. 16 to 19. This embodiment represents another example of the second embodiment including the common cache circuit 111 shown in FIG. 12. In the explanation that follows, the parts similar to the corresponding parts of the first and second embodiments are not explained in detail.

<Configuration Example>

First, an example of the configuration of the nonvolatile semiconductor memory device according to the third embodiment is explained with reference to FIG. 16. This embodiment is configured to perform the copy operation without outputting the original data externally of the nonvolatile semiconductor memory device. This embodiment, therefore, is suitable as configuration in which a correction code generating circuit or an error calculation/correction circuit is packaged in the device.

Figure 16:
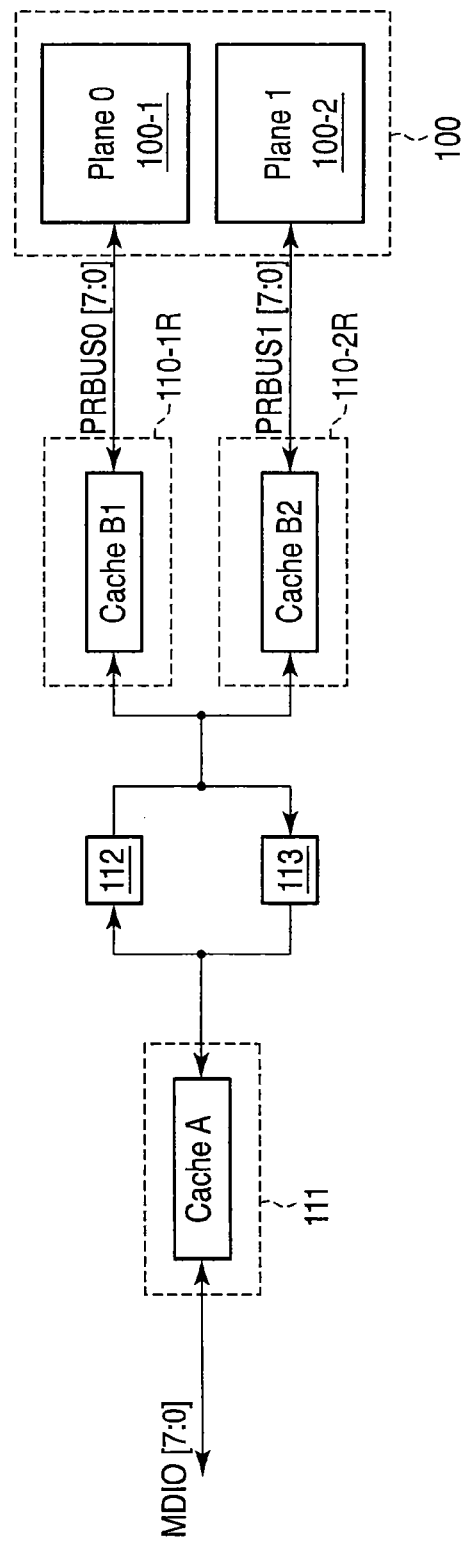
FIG. 16 is a block diagram showing an example of the configuration of a common cache circuit and a page register of a nonvolatile semiconductor memory device according to a third embodiment.

As shown in FIG. 16, this embodiment is different from the second embodiment in that this embodiment further comprises a correction code generating circuit 112 and an error calculation/correction circuit (error detection circuit) 113.

The correction code generating circuit 112 generates a redundant code from the write data at the time of data transfer from the common cache circuit 111 to the first data holding circuit 110-1R or the second data holding circuit 110-2. A parity generating circuit, etc. is an example of the correction code generating circuit 112. The input of the correction code generating circuit 112 is connected to the common cache circuit 111, and the output of the correction code generating circuit 112 is connected to the first and second data holding circuits 110-1R, 110-2R.

The error calculation/correction circuit (error detection circuit) 113, conversely to the correction code generating circuit 112, detects the presence or absence of an error from the read data at the time of data transfer from the first data holding circuit 110-1R or the second data holding circuit 110-2R to the common cache circuit 111. The error calculation/correction circuit 113 corrects an error which may be detected. The input of the error calculation/correction circuit 113 is connected to the first and second data holding circuits 110-1R, 110-2R, and the output of the error calculation/correction circuit 113 is connected to the common cache circuit 111.

As described above, the configuration according to this embodiment has the advantage that the convenience can be secured by the control operation described later, while at the same time improving the data reliability by the on-chip error correction.

<Control Operation>

Figure 17:
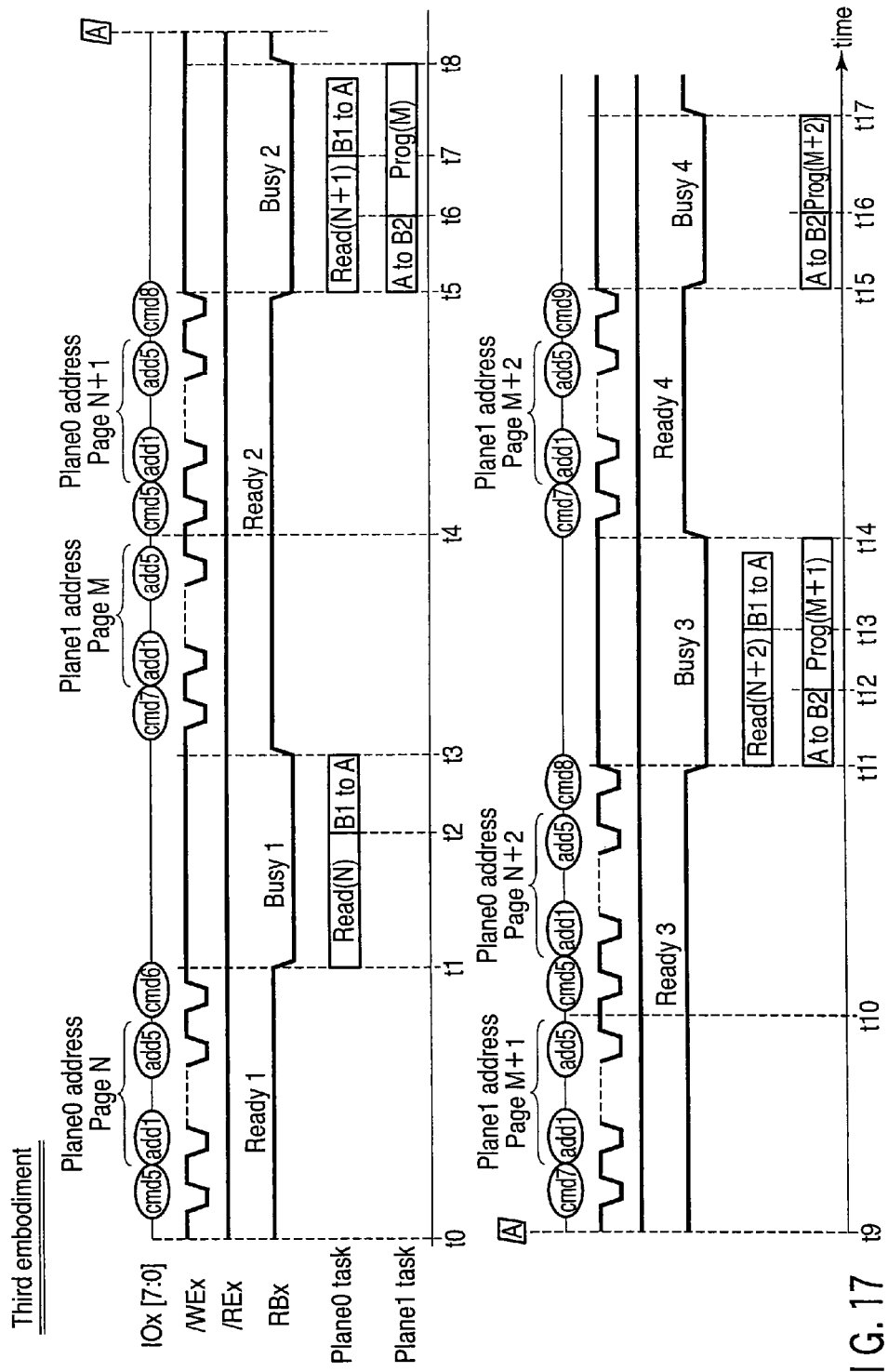
FIG. 17 is a timing chart showing the control sequence for the nonvolatile semiconductor memory device according to the third embodiment.

Next, the control operation of the nonvolatile semiconductor memory device according to this embodiment is explained with reference to FIG. 17. This embodiment is explained taking up an example of a series of operations in which the data read operation is performed in the nonvolatile semiconductor memory device for the write data of 1 Kbytes in plane 0 (100-1) side, and the data thus read is held in the first data holding circuit 110-1R and then provisionally accumulated in the common cache circuit 111, after which the accumulated data is transferred to and written in the second data holding circuit 110-2R.

Incidentally, the physical position for the data read or write operation is not limited. Alternatively, therefore, the data can be read in plane 1 (100-2) while being written in plane 0 (100-1).

First, assume that a start command cmd5 to start the data read operation is input to plane 0 at time point t0, followed by inputting a plane address (plane0 address) add1 to add5 (page N) and a command cmd6.

At time point t1, the data read operation is started. At the same time, the nonvolatile semiconductor memory device sends a busy signal externally to notify that it is in operation internally. Various notification methods are available. In the case under consideration, for example, the ready busy pin RBx is set to low ("L") level for this purpose. During the busy period (Busy 1), the data read operation is performed for page N (Read (N)). The data thus read is stored in the first data holding circuit 110-1R.

Then, at time point t2, the data stored in the first data holding circuit 110-1R is copied to the common cache circuit 111 (B1 to A). In the process, the data may alternatively be left in the first data holding circuit 110-1R.

At time point t3, an address input start command cmd7 and a write address (the page address M (Page M) in this case) are sequentially input to the nonvolatile semiconductor memory device.

At time point t4, the next read address (the page address N+1 (Page N+1) in this case) is input. The write address and the read address may be input in that order or reverse order.

At time point t5, after two different addresses are completely input, the start command cmd8 is issued to start the operation, so that the data read operation (Read (N+1)) is performed for page N+1 in plane 0 (Plane0 task). At the same time, the write data held in the common cache circuit 111 is copied in plane 1 (Plane1 task) to the second data holding circuit 110-2R (A to B2). In the process, the nonvolatile semiconductor memory device similarly issues a busy signal externally of the device, indicating that it is in operation internally (Busy 2) thereby to prevent the input of the command and the address for the next data read and write operations.

At time point t6, the data write operation (Prog (M)) for page M is started in plane 1 (Plane1 task).

At time point t7, the read data held in the first data holding circuit 110-1R is copied to the common cache circuit 111 (B1 to A).

At time point t8, after the entire internal operation, i.e. the data write operation for page M of plane 1 is completed in this case, the ready busy pin RBx is set to high ("H") level notifying that the operation is over (Ready 3).

Generally, the time required for the data read operation is shorter than the time required for the data write operation. This embodiment also represents a case in which the data write operation is longer than the data read operation. The ready busy pin RBx, though changed to high level at the time point when the data write operation is complete, is not necessarily so changed at the particular time point, and may alternatively be changed, for example, at the time point when the data read operation is completed. In other words, the notification is sufficient as to whether the next command is acceptable or not.

At time point t9, the command cmd7 and the plane address (Plane1 address) add1 to add5 (Page M+1) for the next data write operation in plane 1 are sequentially input.

At time point t10, the command cmd5 and the plane address (Plane0 address) add1 to add5 (Page N+2) for the next data read operation in plane 0 are sequentially input.

At time point t11, with the operation started in response to the operation start command cmd8 input, the data read operation for page N+2 is performed in plane 0 (Read (N+2)). At the same time, the write data held in the common cache circuit 111 is copied to the second data holding circuit 110-2R in plane 1 (A to B2). In the process, the busy signal is similarly sent as a notification externally of the device (Busy 3).

The subsequent operations are similar to the corresponding operations performed at time points t6 and t7.

At time point t14, the data write address input start command cmd7 and the write address (M+2 (Page M+2) in this case) are sequentially input.

At time point t15, with the start command cmd9 issued to perform the data write operation for plane 1, the data write operation for plane 1 is started in the device (Busy 4). In the process, the read operation is not performed in plane 0.

At time point t17, upon completion of the data write operation in plane 1, the ready busy pin RBx is set to high ("H") level thereby to end a series of operations.

<Data Occupation of Control Operation>

Next, the occupation of data in the first data holding circuit 110-1R, the second data holding circuit 110-2R and the common cache circuit 111 at each time point by the aforementioned control operation of the nonvolatile semiconductor memory device is explained with reference to FIG. 18.

As shown in FIG. 18, according to this embodiment, the data read operation and the data write operation can be temporally overlapped with each other and, therefore, the total operation time can be advantageously shortened.

In the period between time points t5 and t8 and the period between time points t11 and t14, for example, the data read operation and the data write operation can be performed in overlapped relation with each other.

The configurational restriction of the existing NAND-type flash memory, for example, is accompanied by the address restriction that the original and the copy destination belong to the same plane in the page data copy operation to copy the data to another page without being output externally. This restriction is considerably high especially for the products having a large device capacity.

This embodiment, in contrast, is so configured that the data read operation and the data write operation can be temporally overlapped over a plurality of planes including plane 0 and plane 1, and therefore, free of the address restriction as well as the same-plane restriction.

[Fourth Embodiment (Example Involving Task Scheduling)]

Next, a nonvolatile semiconductor memory device according to a fourth embodiment and the control operation thereof are explained with reference to FIGS. 19 to 22. This embodiment represents a case configured of the common cache circuit 111 to carry out the task scheduling further during the period when the data read operation and the data write operation are overlapped with each other. In the description that follows, the parts similar to those of the aforementioned embodiments are not explained in detail.

<Example of Configuration>

An example of the configuration of the nonvolatile semiconductor memory device according to this embodiment is configured of the common cache circuit 111 shown in, for example, FIGS. 13 and 18.

<Control Operation>

Now, the control operation of this embodiment is explained with reference to FIGS. 19 to 22. This embodiment concerns a case in which the data write operation is performed in plane 1 and the data read operation in plane 0 in temporally overlapped relation with the data write operation.

The data read operation includes a plurality of "read tasks (Read #N (N=1, 2, 3, ... ))" corresponding to the read address. The data write operation, on the other hand, includes a plurality of "write tasks (Prog #M (M=1, 2, 3, ... ))" and "verify tasks (PVFY #M (M=1, 2, 3, ... ))" corresponding to the write address. In the case where the data read operation or the data write operation is performed for each page (for example, 1 Kbytes) with the nonvolatile semiconductor memory device according to this embodiment, for example, the read tasks, the write tasks and the verify tasks are repeated about eight times for every 128 bytes.

This embodiment takes the aforementioned point into consideration. In addition, this embodiment takes note of the fact that the verify task and the read task are substantially equivalent or equal in potential to each other in terms of the voltage relation between the bit line and the word line. This point is explained below more specifically.

Figure 19:
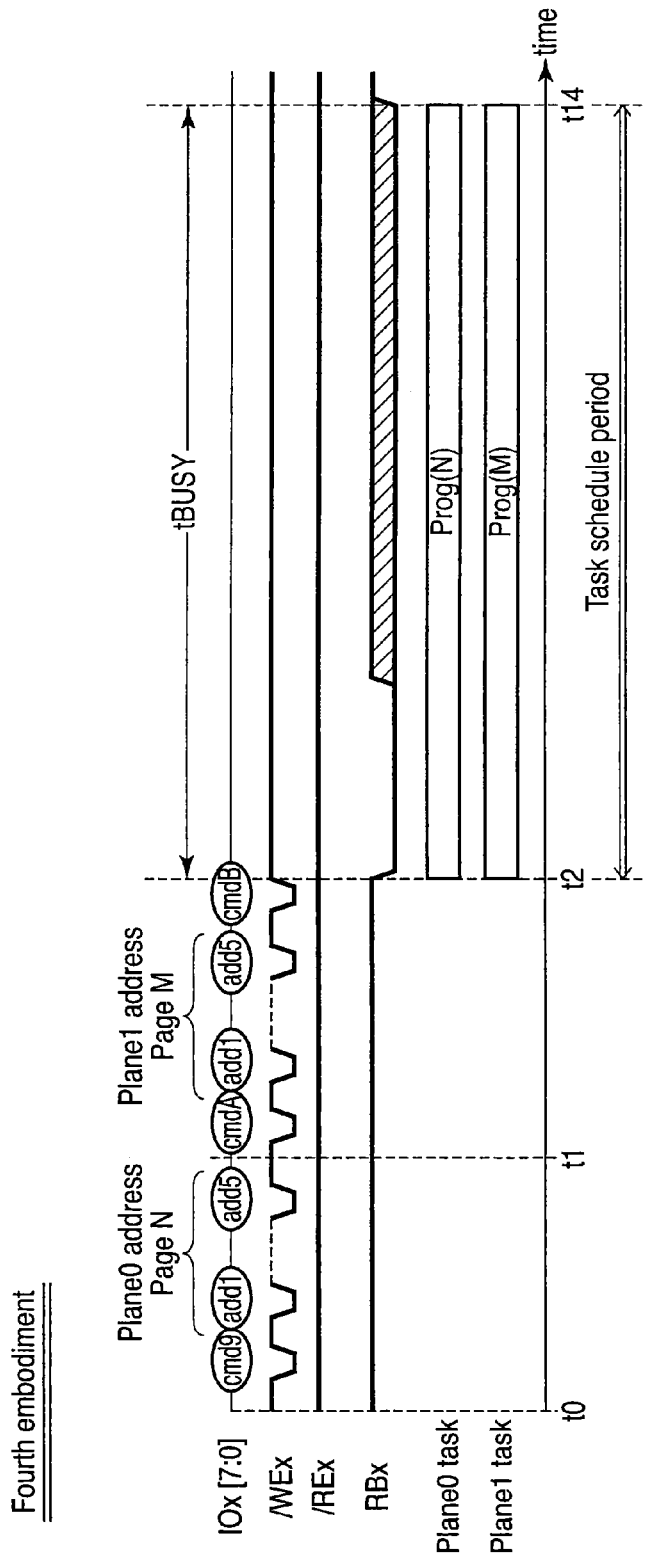
FIG. 19 is a timing chart showing the control sequence for a nonvolatile semiconductor memory device according to a fourth embodiment.

As shown in FIG. 19, the read address (Page N) in plane 0 is input following the command cmd9 at time point to.

Then, at time point t1, the write address (Page M) in plane 1 and, if necessary, a required number of data not shown are input following the command cmdA.

At time point t2 when the operation start command cmdB is input, a command is issued to start the data read operation and the data write operation at a subsequent time point. In the process, the ready busy pin RBx of the device is set at low level thereby to externally notify that the device is busy. Incidentally, the operation of planes 0 and 1 can be combined arbitrarily in any other way. This is the case not only with the write operation but also with the erase operation.

At time points including and subsequent to time point t2, the task scheduling is carried out for the data write operation and the data read operation internally of the device. The task scheduling is explained later with reference to FIG. 20. In the process, the ready busy pin RBx may be changed as required to notify that the read data is ready. Although this notification is indicated by hatching in FIG. 19, other notification means may be used with equal effect.

<Task Scheduling Control>

The task scheduling control operation according to this embodiment is explained below with reference to FIG. 20. FIG. 20 shows an example of the task scheduling for planes 0 and 1. This example represents a case in which the data read operation and the data write operation are performed on a page of data for each four task groups (data group 1, data group 2, data group 3, data group 4).

First, the write task (Prog #1) for data group 1 of plane 1 is executed at time point t2.

Then, after completing the write task at time point t3, the verify task (PVFY #1) is executed for data group 1 to judge whether the same data group 1 has been written or not.

Then, at time point t4, the read task (Read #1) is executed for data group 1 on plane 0 side. According to this embodiment, the verify task and the read task are executed by taking into consideration the configuration in which the bit line and the word line of both tasks are in substantially equivalent or equal voltage relation to each other. Therefore, the verify task and the read task can be performed continuously without considerably changing the internal increase or decrease in potential. As a result, the standby time which otherwise might be required for potential stabilization can be omitted, thereby advantageously achieving a higher overall operation speed.

In addition, the advantages described below are expected. According to the conventional task scheduling, the requests for the data write operation and the data read operation are met by performing one of the operations (for example, the data write operation) in advance of the other operation, and upon completion of the particular one operation, the other operation (for example, the data read operation) is performed. In such a case, the result of the data read operation cannot be output until completion of the entire data read operation. This configuration is disadvantageous especially for the page access request to read the data of a small number of bytes. According to this embodiment, however, the data can be output externally of the device in an early stage in the case where only the data contained in the first data group (data group 1) is desired to read preferentially.

In the shown case, for example, the read task (Read #1) for the first data group (data group 1) is completed at time point t5. Therefore, the read data for the first data group (data group 1) can be advantageously output externally of the device at time point t5.

The result of reading data group 1 is stored in the common cache 111 shown in FIG. 13, and the completion of the read operation for the first data group 1 may be notified externally by, for example, setting the ready busy pin RBx at high level.

The task scheduling for data group 2 and subsequent data groups to be executed at time point t5 and subsequent time points is similar to that for data group 1, and therefore, not described in detail.

<Task Schedule Flow>

Next, the operation flow shown in FIGS. 19 and 20 is explained with reference to FIG. 21. This operation flow is controlled mainly by, for example, the array control circuits 108-1, 108-2, the page register control circuits 110-1, 110-2 and the sequence control circuit 107 shown in FIG. 8.

First, in step S101, the address is input for the data read operation of plane 0. This step corresponds to the operation performed during the period of time t0 to t1 in FIG. 19.

Then, in step S102, the address and the data are input for the data write operation of plane 1. This step corresponds to the operation performed during the period of time t1 to t2 in FIG. 19. Incidentally, steps S101 and S102 may be executed either in that order or the reverse order.

Next, in step S103, the ready busy pin RBx is set to low level after the operation start command. Further, the P counter (first column address counter) designating the data group number for the data write operation and the R counter (second column address counter) designating the data group number for the data read operation described later are initialized. In the case under consideration, both counters are set to "0" for this purpose. Specifically, these counters correspond to the column address counters and, in the general configuration shown in FIG. 12, are arranged in the array control circuits 108-1 and 108-2, respectively.

Then, before starting a data write operation, step S104 judges whether the particular data write operation is to be performed or not. In the absence of even a data write bit in a given data group, for example, the very data write operation is not required, and both the data write operation and the verify operation for the particular data group can be omitted. In the case where no data exists for the data write operation and the data write operation can be omitted, therefore, the process jumps to step S107. Upon judgment that the data write operation is required, on the other hand, the process proceeds to step S105.

In step S105, the write task Prog #1 is executed. Specifically, this operation includes the operation of applying a predetermined data write potential to the bit line and the word line.

Next, in step S106, the verify task PVFY #1 (verify read) is executed.

Then, step S107 judges whether the data read operation is to be performed or not. Upon judgment that the data read operation is to be performed, the process proceeds to step S108. Otherwise, the process proceeds to step S110. This judgment is made in the manner described below.

The task schedule shown in FIG. 20 represents a case in which the data write operation and the data read operation are performed in one-to-one relation. Nevertheless, the embodiment is not limited to this example, and in the case where the result of verifying the write task for one data group in the data write operation fails, the write and verify tasks for the same data group may be performed a plurality of times. In such a case, the control operation is required to perform the data read operation for the particular data group only once following the first verify task but not following the second and subsequent verify tasks. In this case, the control operation is also required in which only the first read task but not the second and subsequent read tasks of the data read operation is executed for the particular data group. This process is controlled by judgment in step S107. Specifically, judgment is made to perform the data read operation only once, immediately after the value on the R counter is changed. If the value on the R counter is not changed, and step S107 is executed second time or thereafter, the data read operation for the particular data group is regarded as having been completed. Accordingly, judgment is made not to perform the data read operation.

In step S108, the read operation is performed for the data group designated by the R counter of plane 0. Once the data of the first data group is completely stored in the common cache circuit 111, the ready busy pin RBx may be turned to high level to notify that the particular data group is ready to be read. At the same time, the value on the R counter designating the read data group in the device is changed in preparation for the next read operation. Specifically, the unity (1) is added to the value on the R counter. More specifically, the value on the column address counter for plane 0 in the address control circuit 108-1 is changed.

Step S110 judges whether the result of the program verify task for the particular data group has passed or failed to pass a predetermined verify value. This judgment may follow a predetermined criterion. Once the program verify task result is judged to have passed the predetermined verify value, the process proceeds to step S111 to perform the write operation and the verify operation for the next data group, while upon judgment that the program verify task result is judged to have failed to pass the predetermined verify value, on the other hand, the process proceeds to the program operation (step S105) for writing the particular data group again, and the rewrite operation is performed.

Upon judgment that the condition is satisfied in step S110, step S111 changes the value on the counter designating a read data group in the device in preparation for the write operation for the next data group. Specifically, the unity (1) is added to the value on the P counter. More specifically, the value on the column address counter for plane 1 arranged in the address control circuit 108-2 is changed.

In order to terminate the internal operation after completion of the write and read operations for the four data groups, step S112 judges whether the write and read operations up to the last data group are complete or not. Upon judgment that the operation is complete up to the last data group, or once the values on both the P and R counters exceed 3, the operation is terminated. In the case where the judgment is that the operation for the last data group has yet to be completed, on the other hand, the process returns to step S104 and the incomplete operation continues to be performed.

<Control of Ready Busy Pin>

Figure 21:
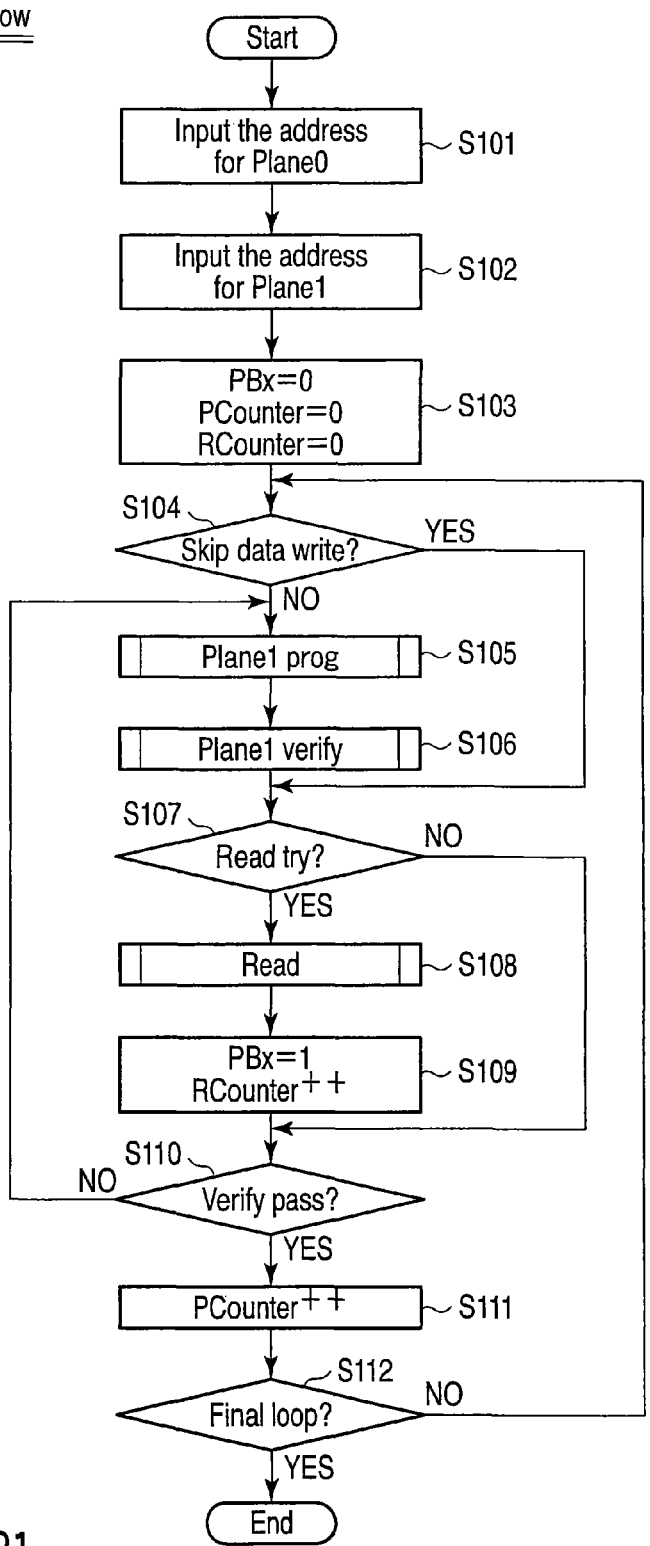
FIG. 21 is a flowchart showing the task schedule flow for the nonvolatile semiconductor memory device according to the fourth embodiment.

Next, the control operation for the ready busy pin RBx not shown in FIG. 21 is explained with reference to FIG. 22. In this example, the ready busy pin RBx can be controlled independently of the task schedule flow shown in FIG. 21. Advantageously, therefore, the internal state of the common cache circuit 111 can be kept monitored and once the common cache circuit 111 is depleted of the data, the ready busy pin RBx can be set at low level to notify the busy mode externally of the device.

Figure 22:
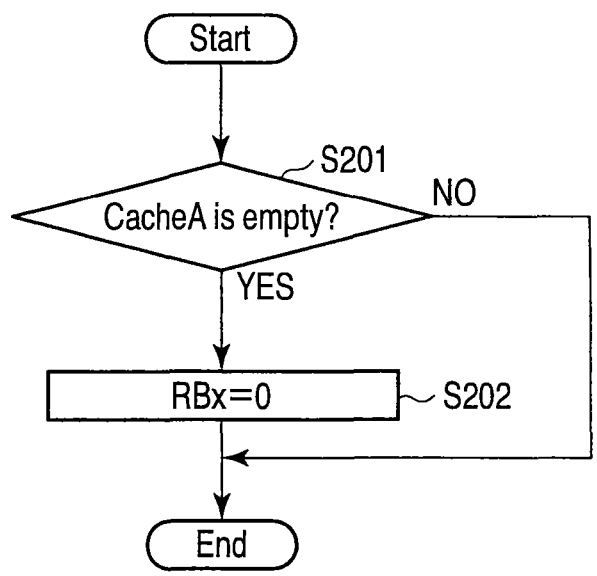
FIG. 22 is a flowchart for controlling the RBx pin of the nonvolatile semiconductor memory device according to the fourth embodiment.

As shown in FIG. 22, step S201 monitors the cache A in the common cache circuit 111 to judge the presence or absence of data in the cache A. Upon judgment that no data exists in the cache A (YES), the process proceeds to step S202, while upon judgment that the data exists in the cache A (NO), on the other hand, the process is ended without performing any operation (END).

In step S202, the ready busy pin RBx is set to low level thereby to notify the busy mode externally of the device.

The control flow of the ready busy pin RBx described above is advantageous in that the data can be made ready to be read out of the device once the preparation of the data of one data group is completed for the common cache circuit 111 in the flow shown in FIG. 21.

Though not shown, the data is read as the control circuit (controller) connected to the nonvolatile semiconductor memory device toggles the read enable pin /REx.

Nevertheless, a means is provided to notify the control circuit (controller) that the data of the next data group is not yet ready at the time when an attempt is made to read the data more than the data amount already prepared in the common cache circuit 111.

[Second Modification (Example in which Rewrite Operation is Performed Until the Verify Task Passes the Condition)]

Next, a second modification of the fourth embodiment is explained with reference to FIG. 23. This second modification represents a case in which the data group for the read task fails to be synchronized with the data group of the write task and the verify task by rewriting until the verify task passes. Upon judgment that the verify task following the write task for a given data group fails to satisfy the condition, for example, the rewrite operation (in the case under consideration, the write task and the verify task are executed a total of three times for the data group 1) may be performed. In such a case, the read operation for the second write and verify tasks is performed on data group 2.

Figure 23:
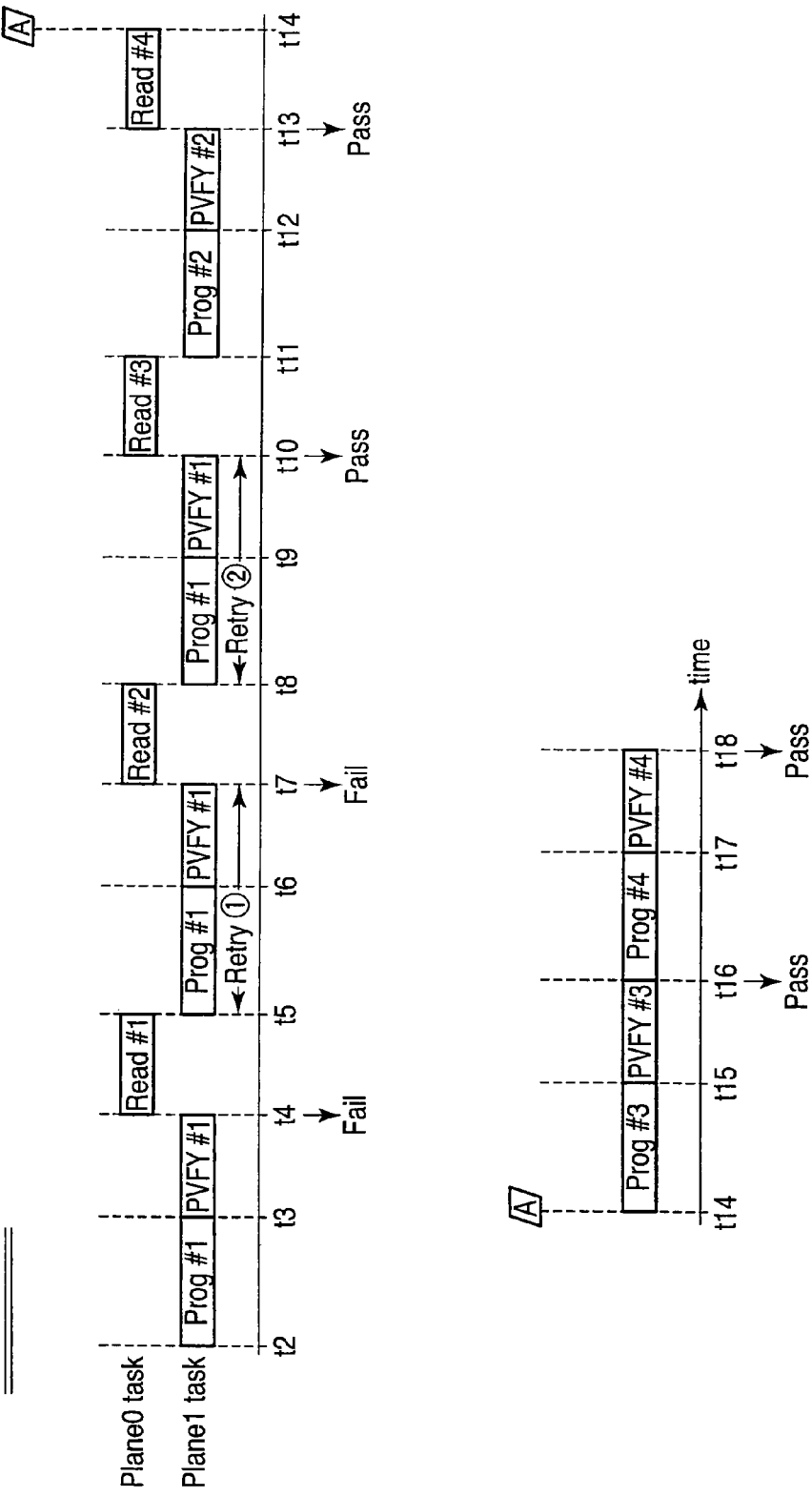
FIG. 23 is a timing chart showing the control sequence for a nonvolatile semiconductor memory device according to a second modification.

More specifically, as shown in FIG. 23, the write task (Prog #1) and the verify task (PVFY #1) are executed for data group 1 as in the aforementioned case at time points t2 and t3.

Then, at time point t4, the verify task (PVFY #1) executed for data group 1 in step S107 is judged as a failure.

Although this embodiment is carried out by the flow similar to FIG. 21, the condition for step S107 is required to be changed. In the aforementioned case, judgment is made to perform the data read operation only once, immediately after the value on the R counter is changed. If the value on the R counter is not changed, and step S107 is executed second time or thereafter, the data read operation for the particular data group is regarded as having been completed. Accordingly, judgment is made not to perform the data read operation. According to this second modification, however, the value on the R counter is changed each time, and the read operation is performed for the first time whenever it is performed. Therefore, judgment is made to perform the data read operation, as long as the value on the R counter fails to exceed the number of data groups making up the page. Specifically, unless the value on the R counter exceeds 3, the process proceeds to step S108. Otherwise, the process proceeds to step S110.

On plane 0 side, on the other hand, the read task (Read #1) is carried out for data group 1 as in the aforementioned case.

Then, at time points t5 and t6, the write task (Prog #1) and the verify task (PVFY #1) are carried out again (Retry (1)) for data group 1 as in the aforementioned case involving the failure judgment.

At time point t7, the verify task for data group 1 (PVFY #1) carried out in step S107 is judged as a failure again. In the process, the read task (Read #2) continues to be carried out for the next data group 2 on plane 0 side.

At time points t8 and t9, the write task (Prog #1) and the verify task (PVFY #1) are carried out again (Retry (2)) for data group 1 as in the aforementioned case involving the failure judgment.

At time point t10, the verify task (PVFY #1) carried out for data group 1 in step S107 is judged as a pass again. In the process, the read task (Read #3) continues to be carried out for the next data group 3 on plane 0 side.

At time points t11 and t12, the write task (Prog #2 and the verify task (PVFY #2) are carried out for the next data group 2. In the process, the read task (Read #4) is executed for the next data group 4 on plane 0 side.

After that, a similar operation is repeated until all the data read and write operations are complete.

[Third Modification (Example in which Verify Task and Read Task are Overlapped)]

Next, a third modification is explained with reference to FIG. 24. This modification represents a case in which the verify task and the read task are overlapped with each other.

As apparent from FIG. 10, the voltage applied to the memory cells in the data read operation (Read) is lower than the voltage applied for the data write operation (Program) or the data erase operation (Erase). During the data read operation (read task execution) and the verify task execution, therefore, a greater current can be output from the pump circuit than during the data write operation or the data erase operation.

In view of this, as shown in FIG. 24, according to this third modification, the write task is executed only in one of the planes, while the verify task and the read task are executed concurrently in temporally overlapped relation with each other.

In this case, the control flow is basically similar to that shown in FIG. 21 except that in this modification, steps S106 to S108 are executed simultaneously. The operation flow shown in FIG. 21, therefore, can be used by changing the order of execution appropriately as required.

More specifically, at time points t0 and t1 not shown, like in the aforementioned case, the read address, the write address and the required command are input for planes 0 and 1.

At time point t2, the write task (Prog #1) is carried out for data group 1 in plane 1.

Then, at time point t3, the verify task (PVFY #1) is executed for data group 1 in plane 1 while at the same time executing the read task (Read #1) for data group 1 in plane 0. This is because, as shown in FIG. 10, a greater current can be output from the pump circuit during the data read operation (read task execution) or the verify task execution than during the data write operation or the data erase operation.

A similar operation is performed subsequently until all the data read and write operations are completed.

Although the third modification has been explained above mainly with reference to the data write operation and the data read operation, the embodiment is not limited to these operations. For example, the embodiment is applicable also to a combination of the data erase operation and the data read operation in which a larger output current is produced from the pump circuit. Especially, as apparent from FIG. 10, the data erase operation, for its physical characteristic, takes a longer time than the data write operation, and therefore, is performed by dividing the data into a plurality of data groups as in this embodiment to suppress the current consumption and local heating. Further, the data rewrite operation, which is a combination of the data write operation and the data erase operation, may be combined with the data read operation. In any case, even during the data write or erase operation, a part of the data in each page can be acquired by the data read operation advantageously earlier than in the prior art. The advantage of this configuration is great especially for a resistance random access memory (ReRAM) such as the nonvolatile semiconductor memory device employed in this embodiment.

[Fifth Embodiment]

Next, a nonvolatile semiconductor memory device according to a fifth embodiment and the control operation thereof are explained with reference to FIGS. 25 and 26. This embodiment has the internal configuration such as the page register circuit may or may not be the same as that of the first to fourth embodiments. An explanation is given below about an example in which the first operation for plane 0 is the erase (reset) operation and the second operation for plane 1 is the data read operation.

<Configuration Example>

An example of the configuration according to this embodiment is explained with reference to FIG. 25. In this embodiment, the bias on the memory cell array 100 is controlled. This embodiment, therefore, is different from the embodiments and modifications described above in that in this embodiment, as long as the state of the array control circuit 108-1 is controlled by the flip-flop circuits FF11 to FF14 as shown in FIG. 25, a signal (SUSPEND)_to_1 for recognizing the USEL_UP, PULSE and RR states is generated and input to the array control circuit 108-2 of the other plane, or plane 1 in this case, during which the read operation is suspended, while the operation is resumed with low power consumption.

With this configuration, the stable operation can be secured by removing instability factors such as current supply capacity during, for example, the period of the first operation in which the second operation is overlapped and a large amount of current is consumed. Nevertheless, a nonvolatile semiconductor memory device high in speed can be configured by the multiplication of operations.

More specifically, as shown in FIG. 25, this embodiment includes the array control circuits 108-1, 108-2 and a recognition signal generator 108-3.

The array control circuit 108-1 is configured of a plurality of flip-flop circuits FF11 to FF14 and AND circuits AND11 to AND14. The output Q (E_SETUP) of the flip-flop circuit F11 is connected to the input of the AND circuit AND11. The output of the AND circuit AND11 is connected to the input D of the flip-flop circuit FF12. The output Q (E_USEL_UP) of the flip-flop circuit FF12 is connected to the input of the AND circuit AND12. The output of the AND circuit AND12 is connected to the input D of the flip-flop circuit FF13. The output Q (E_PULSE) of the flip-flop circuit FF13 is connected to the input of the AND circuit AND13. The output of the AND circuit AND13 is connected to the input D of the flip-flop circuit FF14. The output Q (E_RR) of the flip-flop circuit FF14 is connected to the input of the AND circuit AND14. The flip-flop circuits FF11 to FF14 are reset by the input thereto of a reset signal RSTn and operated in synchronism with the clock input. A signal E_TIMEUP is input to the input terminals of the AND circuits AND11 to AND14.

The array control circuit 108-2 is configured of a plurality of flip-flop circuits FF21 to FF24 and AND circuits AND21 to AND24. The output Q (R_SETUP) of the flip-flop circuit FF21 is connected to the input of the AND circuit AND21. The output of the AND circuit AND21 is connected to the input D of the flip-flop circuit FF22. The output Q (R_USEL_UP) of the flip-flop circuit FF22 is connected to the input of the AND circuit AND22. The output of the AND circuit AND22 is connected to the input D of the flip-flop circuit FF23. The output Q (R_PULSE) of the flip-flop circuit FF23 is connected to the input of the AND circuit AND23. The output of the AND circuit AND23 is connected to the input D of the flip-flop circuit FF24. The output Q (R_RR) of the flip-flop circuit FF24 is connected to the input of the AND circuit AND24. The flip-flop circuits FF21 to FF24 are reset by the input of a reset signal RSTn and operate in synchronism with the input of the clock. The output of the recognition signal generator 108-3 is input to the AND circuits AND21 to AND24.

The recognition signal generator 108-3 generates a signal SUSPEND_to_1 to recognize the USEL_UP, PULSE and RR states between planes 1 and 0, and inputs this signal to the array control circuit 108-2 of the other plane. The read operation is suspended during this period and resumed after the low power consumption is reduced. According to this embodiment, the recognition signal generator 108-3 is configured of an OR circuit OR, an inverter IN0 and an AND circuit AND30.

The input of the OR circuit OR is connected to the outputs E_USEL_UP, E_PULSE and E_RR of the flip-flop circuits FF12, FF13 and FF14, respectively, and the suspend signal SUSPEND_to_1 is output. The input of the inverter IN0 is connected to the output (suspend signal SUSPEND_to_1) of the OR circuit OR. The input of the AND circuit AND30 is connected to the input of the inverter IN0 and the signal R_TIMEUP, and the output thereof to the input of the AND circuits AND21 to AND24.

<Control Operation>

Next, the control operation of the nonvolatile semiconductor memory device according to this embodiment is explained with reference to FIG. 26. This embodiment illustrates the data erase operation (reset operation) for the ReRAM using a variable resistor.

As shown in FIG. 10, the data erase operation is performed by promoting the oxidation-reduction reaction in a selected variable resistor 33 by Joule heating the particular variable resistor 33 with current pulses. As shown in FIG. 10, for example, an erase voltage ($V_{reset}$) is applied between the word line WL and the bit line BL during the time $t_{reset}$. This time $t_{reset}$ is about several microseconds, and the current is about several microamperes per memory cell.

The data erase operation, like the data read or write operation, is controlled by being divided into a plurality of erase tasks carrying a plurality of data group numbers. Thus, the control circuit 107 controls by dividing the data erase, write and read operations (first operation) into a plurality of erase, read, write and verify tasks, respectively, carrying a plurality of data group numbers on the one hand, and controls by dividing the data erase, write and read operations (second operation) into a plurality of erase, read, write and verify tasks carrying a plurality of data group numbers.

In the case where a plurality of memory cells are reset (erased) at the same time to secure the erase rate, a corresponding current is required to be supplied for a corresponding length of time. In the process, the data read operation (a plurality of data read tasks) constituting the second operation, though low in voltage, is undesirably performed due to the fact that otherwise, the operation might be instabilized and the time taken for power supply stabilization.

In view of this, according to this embodiment, as shown in FIG. 26, the control operation is performed by, for example, a sequence control circuit 107, array control circuits 108-1, 108-2, charge pump control circuits 109-1, 109-2 and page register control circuits 110-1, 110-2. Though not shown, these control circuits include a sync circuit controlled in timing by the clock generating circuit built in the device. The state of these circuits is recognized by the flip-flop circuit controlled by the clock, and though not described in detail, the time of voltage application and pulse application to the word line, for example, is controlled by the timing output from a time counter or a decoder circuit.

Specifically, as shown in FIG. 26, the read task (Read #1(1)) for data group 1 on plane 1 side is executed at time point t0.

Then, at time point t1, the recognition signal SUSPEND_to_1 in the recognition signal generator 108-3 is set to H state with the timing (E_USEL_UP) of applying an inhibit voltage (VUX) to the unselected word line UnSel WL on plane 0 side. Then, the read task (Read #1(1)) for data group 1 under execution on plane 1 side is suspended.

At time point t2, the erase voltage VSEL is applied to the selected bit line Sel BL on plane 0 side thereby to perform the data erase operation.

At time point t3, the voltage on the selected bit line Sel BL on plane 0 side is turned off.

At time point t4, the voltage on the unselected word line UnSel WL on plane 0 side is turned off, and at the timing of ending the erase operation, the recognition signal SUSPEND_to_1 in the recognition signal generator 108-3 is turned to "L" state. Then, the execution of the read task (Read #1(2)) for data group 1 thus far suspended on plane 1 side is resumed.

As described above, in the control operation according to this embodiment, the current is consumed most during the period (time t1 to t4) of the timing to apply the erase (reset) bias, and therefore, any one of the tasks (Read #1) of the second operation of the other plane, i.e. plane 1 in the case under consideration is controlled not to be executed during this period (erase task).

In other words, the control operation according to this embodiment is performed by recognizing the relation between the master operation (the data erase operation in the case under consideration) large in power consumption and the slave operation (the data read operation in the case under consideration) smaller in power consumption than and subject to the master operation. With the start of the master operation, the task of the slave operation is suspended, while at the end of the master operation, the task of the slave operation is resumed. In this way, the operation is controlled by the recognition signal from, for example, the recognition signal generator 108-3.

<Aspects Adapted to be Covered by the Embodiments>

The embodiments and modifications described above cover the aspects described below.

(1) A semiconductor memory device comprising a memory cell array configured of at least first and second portions with a plurality of layers stacked three-dimensionally on a semiconductor substrate and each including a plurality of memory cells with a variable resistor which stores an electrically rewritable resistance value as a data, and a control circuit which controls a first operation including selected one of operations to erase, write and read the data in the first portion and a second operation including selected one of operations to erase, write and read the data in the second portion, the first operation and the second operation being performed in temporally overlapped relation with each other.

(2) The semiconductor memory device according to aspect (1), further comprising a first data holding circuit used for the first operation and a second data holding circuit used for the second operation.

(3) The semiconductor memory device according to aspect (2) further comprising a first bus which connects the first data holding circuit and the first portion of the memory cell array, and a second bus which connects the second data holding circuit and the second portion of the memory cell array.

(4) The semiconductor memory device according to aspect (2) or (3) further comprising a third data holding circuit with an output thereof connected to both the first and second data holding circuits and with the operation thereof shared by the first and second data holding circuits.

(5) The semiconductor memory device according to aspects (1) to (4) further comprising a unit which notifies an external device whether the second operation can be started or not during an execution of the first operation.

(6) A method of controlling a semiconductor memory device comprising controlling a memory cell array configured of at least first and second portions each including a plurality of memory cells with a variable resistor which stores an electrically rewritable resistance value as a data, so as to control a first operation including selected one of operations to erase, write and read the data in the first portion and a second operation including selected one of operations to erase, write and read the data in the second portion, the first operation and the second operation being performed in temporally overlapped relation with each other.

(7) The control method according to aspect (6), wherein the semiconductor memory device comprises a first data holding circuit used for the first operation and a second data holding circuit used for the second operation.

(8) The control method according to aspect (7), wherein the nonvolatile semiconductor memory device further comprises a first bus which connects the first data holding circuit and the first portion of the memory cell array and a second bus which connects the second data holding circuit and the second portion of the memory cell array.

(9) The control method according to aspect (7) or (8), wherein the nonvolatile semiconductor memory device further comprises a third data holding circuit with an output thereof connected to both the first and second data holding circuits and with the operation thereof shared by the first and second data holding circuits.

(10) The control method according to aspects (6) to (9), wherein the nonvolatile semiconductor memory device further comprises a unit which notifies an external device whether the second operation can be performed or not during the execution of the first operation.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a memory cell array configured of at least a first portion and a second portion each including a plurality of memory cells each including a variable resistor which stores an electrically rewritable resistance value as data;
a control circuit which controls a first operation including selected one of operations to erase, write and read data in the first portion and a second operation including selected one of operations to erase, write and read data in the second portion; and
a recognition signal generator which generates a recognition signal causing the first and second portions to recognize the first and second operations, respectively,
wherein the control circuit controls by dividing the data read operation into a plurality of read tasks each carrying a data group number, the data write operation into a plurality of write tasks and a plurality of verify tasks each carrying a data group number, and the data erase operation into a plurality of erase tasks each carrying a data group number,
such that the first operation is controlled by being divided into a plurality of the erase, read, write and verify tasks each carrying a data group number,
the second operation is controlled by being divided into a plurality of the erase, read, write and verify tasks each carrying a data group number, and
the recognition signal generator suspends selected one of the erase, read, write and verify tasks of the first operation,
such that during the suspension, selected one of the erase, read, write and verify tasks of the second operation is started, and upon completion of the particular task, the suspended one of the erase, read, write and verify tasks of the first operation is resumed.

2. The device of claim 1,
wherein the control circuit controls said plurality of verify tasks and said plurality of read tasks to be executed in temporally overlapped relation with each other.

3. The device of claim 1, further comprising:
a plurality of memory cell arrays each having a similar configuration to the memory cell array and stacked three-dimensionally on a semiconductor substrate together with the memory cell array.

* * * * *